United States Patent
Sugimoto et al.

(10) Patent No.: US 10,608,599 B2
(45) Date of Patent: Mar. 31, 2020

(54) VARIABLE GAIN CIRCUIT AND TRANSIMPEDANCE AMPLIFIER USING THE SAME

(71) Applicant: SUMITOMO ELECTRIC INDUSTRIES, LTD., Osaka (JP)

(72) Inventors: Yoshiyuki Sugimoto, Osaka (JP); Naoki Itabashi, Osaka (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 0 days.

(21) Appl. No.: 16/101,102

(22) Filed: Aug. 10, 2018

(65) Prior Publication Data

US 2019/0052236 A1    Feb. 14, 2019

(30) Foreign Application Priority Data

Aug. 14, 2017  (JP) ................... 2017-156407
Jun. 12, 2018  (JP) ................... 2018-112121

(51) Int. Cl.
| | |
|---|---|
| *H03F 3/45* | (2006.01) |
| *H03F 3/08* | (2006.01) |
| *H03G 1/00* | (2006.01) |
| *H03G 3/00* | (2006.01) |
| *H03G 3/30* | (2006.01) |

(52) U.S. Cl.
CPC ............. *H03F 3/082* (2013.01); *H03F 3/087* (2013.01); *H03F 3/45103* (2013.01); *H03F 3/45183* (2013.01); *H03F 3/45475* (2013.01); *H03F 3/45973* (2013.01); *H03G 1/0023* (2013.01); *H03G 1/0035* (2013.01); *H03G 1/0088* (2013.01); *H03G 3/001* (2013.01); *H03G 3/3084* (2013.01); *H03F 2200/405* (2013.01); *H03F 2203/45392* (2013.01)

(58) Field of Classification Search
CPC ............. H03F 3/45; H03F 2203/45022; H03F 2203/45252; H03F 2203/45258
USPC ........................................ 330/252, 253, 254
See application file for complete search history.

(56) References Cited

U.S. PATENT DOCUMENTS 5,384,501 A * 1/1995 Koyama ................ G06G 7/184
                                                          327/336

FOREIGN PATENT DOCUMENTS

| JP | 58-204614 | 11/1983 |
|---|---|---|
| JP | 63-175510 | 7/1988 |
| JP | 11-509711 | 8/1999 |
| JP | 2003-168937 | 6/2003 |

(Continued)

*Primary Examiner* — Steven J Mottola
(74) *Attorney, Agent, or Firm* — Smith, Gambrell & Russell, LLP

(57) ABSTRACT

A transimpedance amplifier includes a variable gain circuit configured to generate a pair of complementary signals in accordance with an input signal and a reference signal. A first differential circuit of the variable gain circuit includes a first transistor including a control terminal to receive the input signal, a second transistor including a control terminal to receive the reference signal, and a variable resistance circuit including a first field effect transistor (FET) and a second FET. A first timing when a voltage of a first linearity adjustment signal input to the first FET reaches a first threshold voltage of the first FET and a second timing when a voltage of a second linearity adjustment signal input to the second FET reaches a second threshold voltage of the second FET are different from each other.

12 Claims, 16 Drawing Sheets

(56) References Cited

FOREIGN PATENT DOCUMENTS

| | | |
|---|---|---|
| JP | 2003-168938 | 6/2003 |
| JP | 2003-243951 | 8/2003 |
| JP | 2004-304775 | 10/2004 |
| JP | 2011-205470 | 10/2011 |
| WO | 97/42704 | 11/1997 |

* cited by examiner

VARIABLE GAIN CIRCUIT AND TRANSIMPEDANCE AMPLIFIER USING THE SAME

TECHNICAL FIELD

The present disclosure relates to a transimpedance amplifier and a variable gain circuit.

BACKGROUND

In an optical communication system, a transimpedance amplifier is used to convert a current signal generated by a photo detector into a voltage signal. In 4-level pulse amplitude modulation (PAM4) transmission, the conversion from the current signal to the voltage signal is required to have linearity. Therefore, the transimpedance amplifier has a variable gain, which is controlled to prevent amplitude of the voltage signal from being saturated. The amplitude of the voltage signal is monitored for a feedback control of the variable gain.

Japanese Unexamined Patent Publication No. 2004-304775 discloses a variable gain differential amplifier. The variable gain differential amplifier includes a pair of transistors, and a variable resistance circuit which is provided between emitters of the pair of transistors. The variable resistance circuit includes a resistor and a field effect transistor (FET) connected in series with the resistor. In the variable gain differential amplifier, a control voltage is applied to the gate of the FET and resistance between the source and the drain of the FET is varied in accordance with the control voltage so as to perform a gain control.

In the configuration of applying the control voltage to the gate of the FET such as the variable gain differential amplifier disclosed in Japanese Unexamined Patent Publication No. 2004-304775, a resistance value between the source and the drain is varied by using a transition state between an ON state for electrically connecting the drain and the source and an OFF state for electrically disconnecting the drain and the source by applying the control voltage close a threshold voltage of the FET. However, the transition state depends on the terminal voltages of the source and the drain. Rising and falling of the terminal voltages may affect the resistance value between the source and the drain. Therefore, there is a concern that an output signal is distorted with respect to an input signal.

In the present disclosure, there are provided a transimpedance amplifier and a variable gain circuit of which the distortion can be reduced.

SUMMARY

A transimpedance amplifier according to an aspect of the present disclosure includes a variable gain circuit configured to generate a pair of complementary signals in accordance with an input signal and a reference signal, and a linearity control circuit configured to generate a plurality of linearity adjustment signals to secure linearity of the variable gain circuit. The complementary signals include a first complementary signal and a second complementary signal. The variable gain circuit includes a first current source configured to supply a first current, a second current source configured to supply a second current, a first differential circuit configured to divide each of the first current and the second current into two parts in accordance with the input signal and the reference signal to generate a first current signal and a second current signal, a first load element configured to generate the first complementary signal based at least in part on the first current signal, and a second load element configured to generate the second complementary signal based at least in part on the second current signal. The first differential circuit includes a first transistor including a control terminal to receive the input signal, a first current terminal to be electrically connected to the first current source, and a second current terminal to output the first current signal, a second transistor including a control terminal to receive the reference signal, a first current terminal to be electrically connected to the second current source, and a second current terminal to output the second current signal, and a variable resistance circuit including a plurality of field effect transistors, each of the field effect transistors being configured such that one of the linearity adjustment signals is input to a gate one-to-one, a source is commonly connected to the first current terminal of the first transistor, and a drain is commonly connected to the first current terminal of the second transistor. The variable resistance circuit has a combined resistance value which is obtained by combining respective resistance values of the field effect transistors. The linearity control circuit supplies the plurality of the linearity adjustment signals to the plurality of field effect transistors such that the combined resistance value becomes larger as amplitude of the input signal or amplitude of the pair of complementary signals is larger. Each field effect transistor has a threshold voltage which is a voltage of the one of the linearity adjustment signals of switching from an OFF state for electrically disconnecting the drain and the source to an ON state for electrically connecting the drain and the source. The plurality of field effect transistors includes a first field effect transistor and a second field effect transistor. The plurality of the linearity adjustment signals include a first linearity adjustment signal input to the first field effect transistor and a second linearity adjustment signal input to the second field effect transistor. The first linearity adjustment signal has a first timing when a voltage of the first linearity adjustment signal reaches a first threshold voltage of the first field effect transistor. The second linearity adjustment signal has a second timing when a voltage of the second linearity adjustment signal reaches a second threshold voltage of the second field effect transistor. The first timing and the second timing are different from each other.

A transimpedance amplifier according to another aspect of the present disclosure includes a variable gain circuit configured to generate a pair of complementary signals in accordance with an input signal and a reference signal, and a linearity control circuit configured to generate a plurality of linearity adjustment signals to secure linearity of the variable gain circuit. The complementary signals include a first complementary signal and a second complementary signal. The variable gain circuit includes a first current source configured to supply a first current, a second current source configured to supply a second current, a first differential circuit configured to divide each of the first current and the second current into two parts in accordance with the input signal and the reference signal to generate a first current signal and a second current signal, a first load element configured to generate the first complementary signal based on the first current signal, and a second load element configured to generate the second complementary signal based on the second current signal. The first differential circuit includes a first transistor including a control terminal to receive the input signal, a first current terminal to be electrically connected to the first current source, and a second current terminal to output the first current signal, a second transistor including a control terminal to receive the reference signal, a first current terminal to be electrically connected to the second current source, and a second current terminal to output the second current signal, and a variable resistance circuit including a plurality of field effect transistors, each of which is configured such that one of the linearity adjustment signals is input to a gate one-to-one, a source is commonly connected to the first current terminal of the first transistor, and a drain is commonly connected to the first current terminal of the second transistor. The linearity control circuit switches each of the plurality of the field effect transistors between an ON state for electrically connecting the drain and the source and an OFF state for electrically disconnecting the drain and the source with the linearity adjustment signal such that a resistance value between the first current terminal of the first transistor and the first current terminal of the second transistor of the variable resistance circuit becomes larger as amplitude of the input signal or amplitude of the pair of complementary signals is larger.

DETAILED DESCRIPTION

Specific examples of a transimpedance amplifier and a variable gain circuit according to embodiments of the present disclosure will be described hereinafter with reference to the drawings. Further, the invention is not limited to the embodiments, but includes meanings which are indicated by the claims and equivalent to the claims, and all the changes within the claims.

First Embodiment

Figure 1:
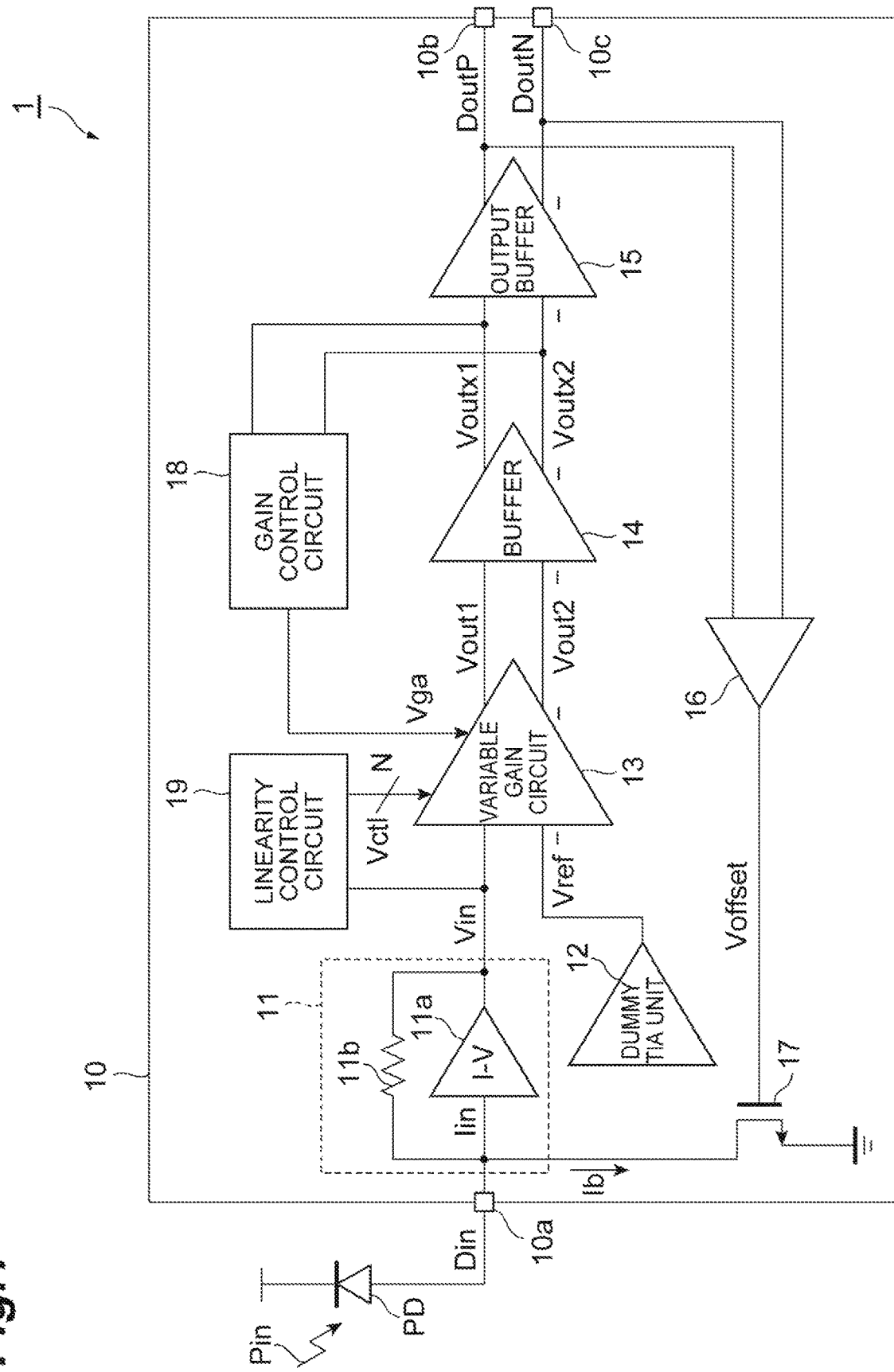
FIG. 1 is a diagram schematically illustrating a configuration of an optical receiver which includes a transimpedance amplifier according to a first embodiment.
Figure 2:
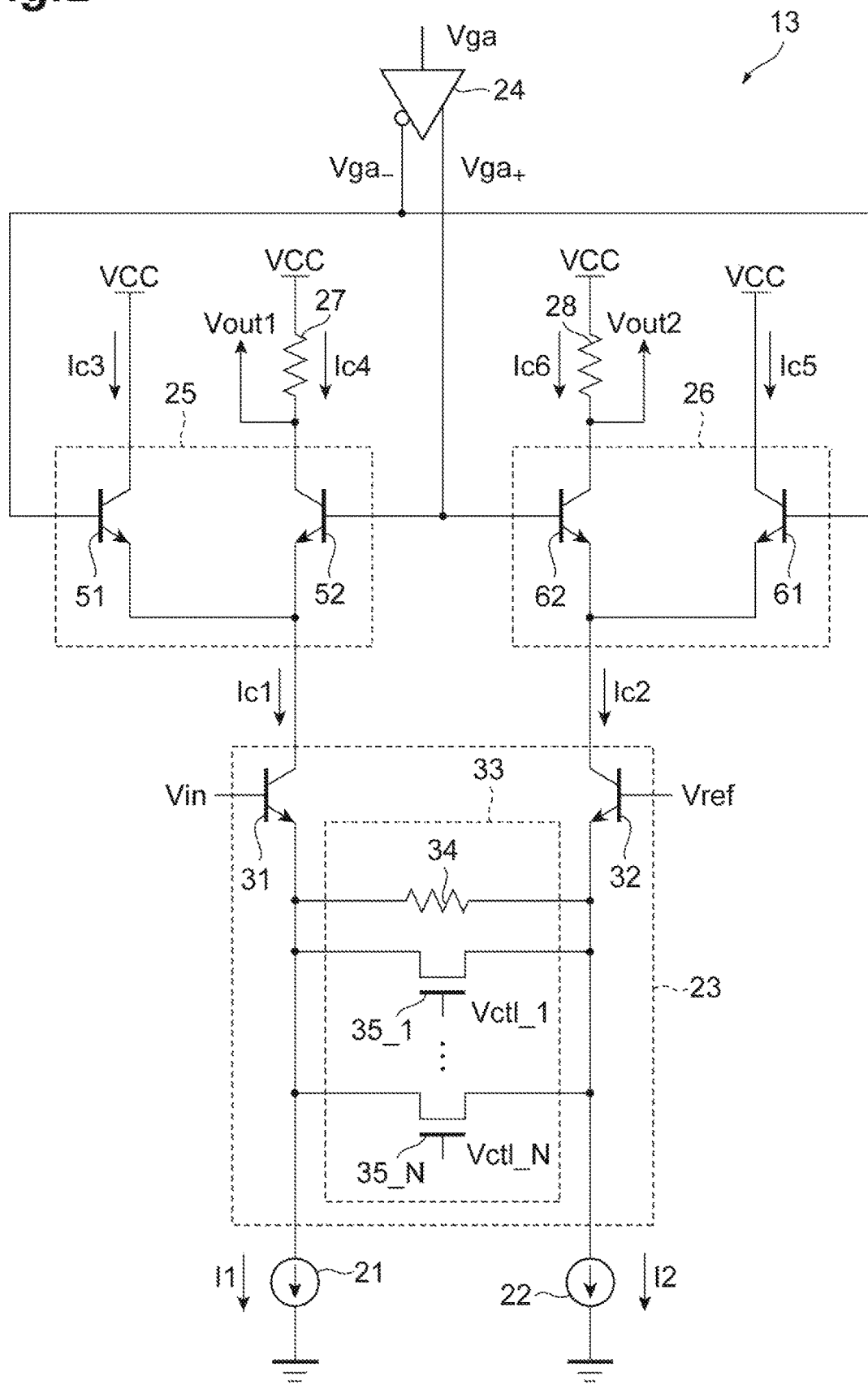
FIG. 2 is a diagram illustrating a circuit structure of a variable gain circuit illustrated in FIG. 1.
Figure 3:
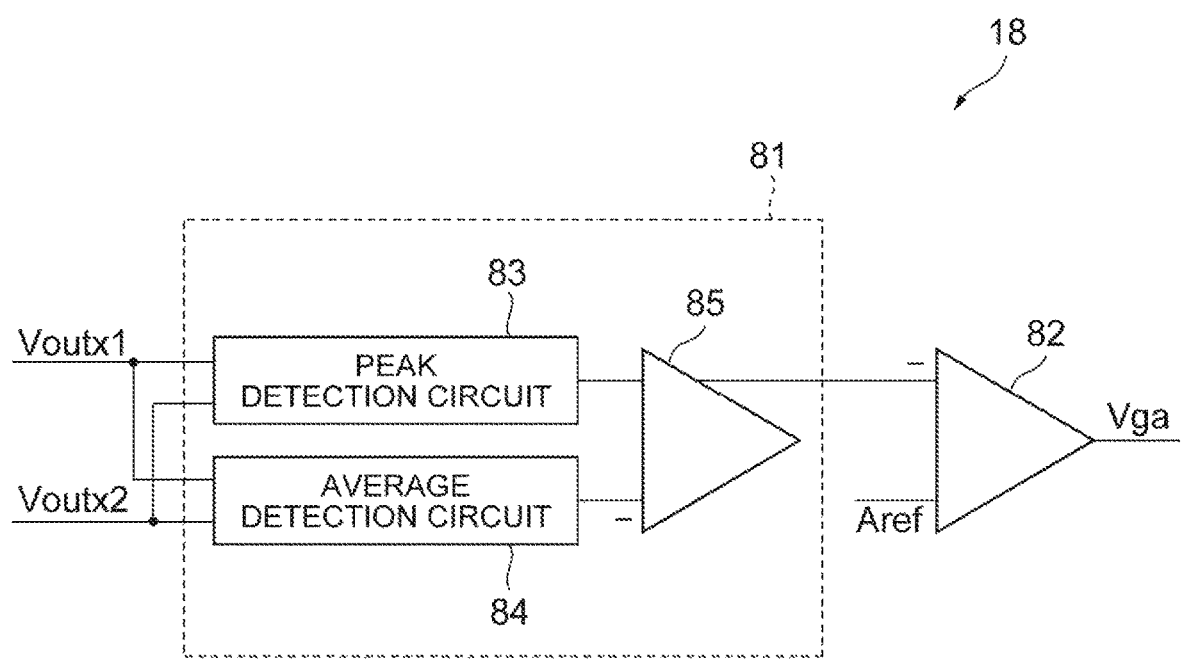
FIG. 3 is a diagram illustrating a circuit structure of a gain control circuit illustrated in FIG. 1.
Figure 4:
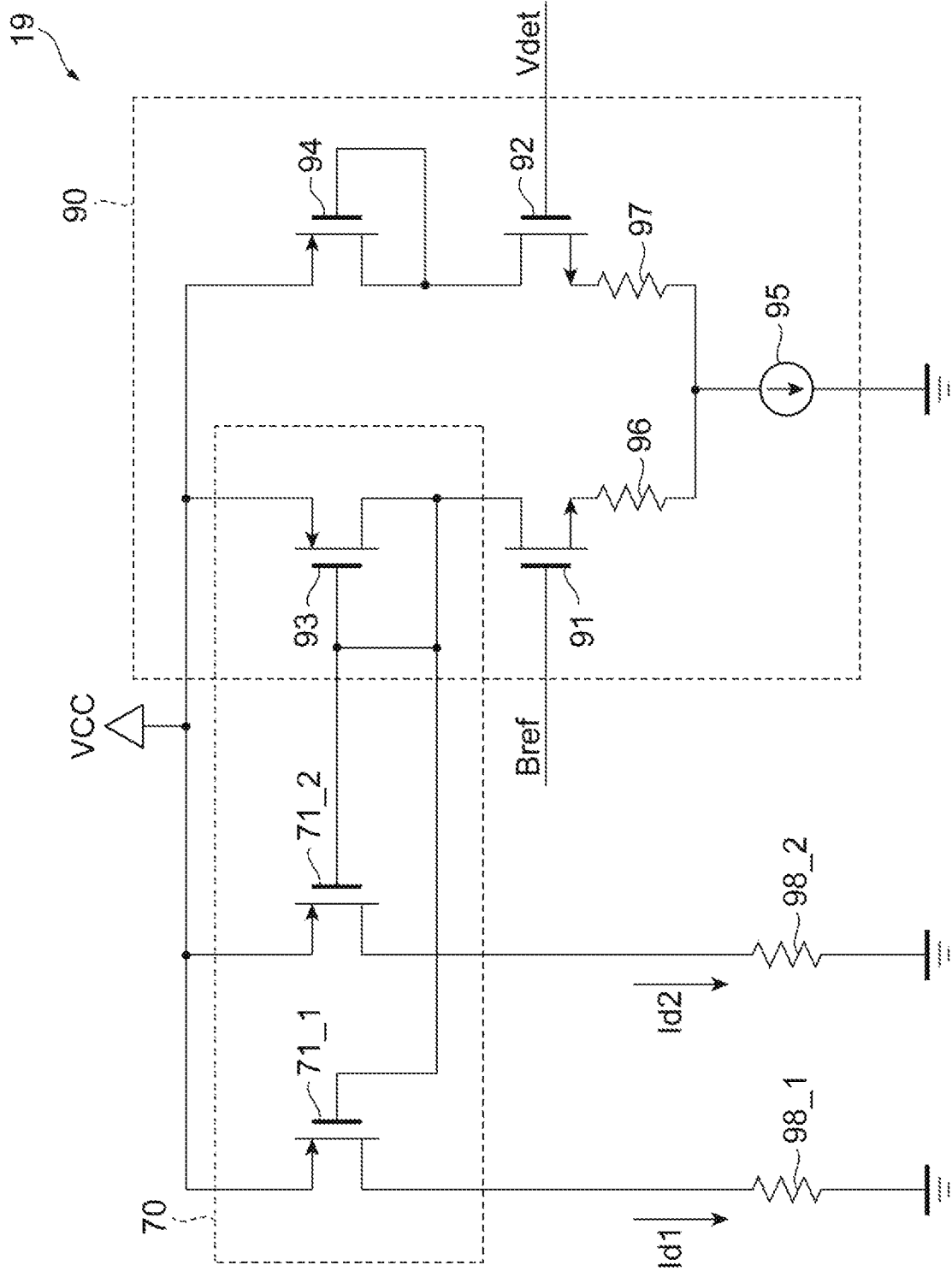
FIG. 4 is a diagram illustrating a circuit structure of a linearity control circuit illustrated in FIG. 1.

FIG. 1 is a diagram schematically illustrating a configuration of an optical receiver which includes a transimpedance amplifier according to a first embodiment. FIG. 2 is a diagram illustrating a circuit structure of a variable gain circuit illustrated in FIG. 1. FIG. 3 is a diagram illustrating a circuit structure of a gain control circuit illustrated in FIG. 1. FIG. 4 is a diagram illustrating a circuit structure of a linearity control circuit illustrated in FIG. 1.

An optical receiver 1 illustrated in FIG. 1 receives an optical signal Pin which is transmitted from an optical transmitter (not illustrated). The optical receiver 1 includes a photo detector PD and a transimpedance amplifier 10. The photo detector PD receives the optical signal Pin, and generates a photo current (current signal) in accordance with the optical signal Pin. The photo detector PD is, for example, a photo diode. One terminal of the photo detector PD is electrically connected to a predetermined bias voltage, and the other terminal of the photo detector PD outputs the photo current.

The transimpedance amplifier 10 receives the photo current from the photo detector PD as an input current signal Din, and generates output signals DoutP and DoutN in accordance with the input current signal Din. The output signals DoutP and DoutN are voltage signals. The output signals DoutP and DoutN are a pair of complementary signals. The transimpedance amplifier 10 includes an input terminal 10a and output terminals 10b and 10c. The input terminal 10a receives the input current signal Din. The output terminal 10b outputs the output signal DoutP, and the output terminal 10c outputs the output signal DoutN. The output signals DoutP and DoutN constitute one differential signal (differential output signal).

The transimpedance amplifier 10 includes a transimpedance amplifier (TIA) unit 11, a dummy TIA unit 12, a variable gain circuit 13, a buffer 14, an output buffer 15, an offset control circuit 16, a bypass circuit 17, a gain control circuit 18, and a linearity control circuit 19.

The TIA unit 11 is a circuit which converts the input current signal Din into a voltage signal Vin (input signal). Specifically, the TIA unit 11 includes an amplifier 11a and a feedback resistance element (feedback resistor) 11b, and generates the voltage signal Vin in accordance with a current signal Iin which is obtained by subtracting a bypass current Ib from the input current signal Din. The TIA unit 11 outputs the voltage signal Vin from an output terminal thereof to the variable gain circuit 13. A gain (a ratio of the magnitude of the voltage signal Vin to the magnitude of the current signal Iin) of the TIA unit 11 is determined by a resistance value (transimpedance) of the feedback resistor 11b.

The dummy TIA unit 12 is a circuit which generates a reference signal Vref. The reference signal Vref is a voltage signal. The dummy TIA unit 12 outputs the reference signal Vref to the variable gain circuit 13. The reference signal Vref is used to convert a single (single-ended) voltage signal Vin into a differential signal in the variable gain circuit 13, and has a predetermined voltage value. The dummy TIA unit 12 may include the amplifier and the feedback resistor similar or identical to the TIA unit 11. With the similar configuration to the TIA unit 11, the dummy TIA unit 12 may generate the reference signal Vref to compensate (cancel) a variation in the voltage signal Vin which is caused by a change in the supply voltage of the amplifier and a change in temperature.

The variable gain circuit 13 is a circuit which generates output signals Vout1 and Vout2 in accordance with the voltage signal Vin and the reference signal Vref. The output signals Vout1 and Vout2 constitute a pair of complementary signals. As illustrated in FIG. 2, the variable gain circuit 13 includes a current source 21 (first current source), a current source 22 (second current source), the differential circuit 23 (first differential circuit), a differential amplifier 24, a differential circuit 25 (second differential circuit), a differential circuit 26 (third differential circuit), a load element 27 (first load element), and a load element 28 (second load element).

The current source 21 is a circuit which supplies a current I1 (first current). The current source 21 supplies the current I1 to the differential circuit 23. The current source 22 is a circuit which supplies a current I2 (second current). The current source 22 supplies the current I2 to the differential circuit 23. The current I1 and the current I2 may be set to be equal.

The differential circuit 23 is a circuit which divides each of the current I1 and the current I2 into two parts in accordance with the voltage signal Vin and the reference signal Vref, and generates a current signal Ic1 (first current signal) and a current signal Ic2 (second current signal). The differential circuit 23 includes a transistor 31 (first transistor), a transistor 32 (second transistor), and a variable resistance circuit 33. A sum of the current I1 and the current I2 is substantially equal to a sum of the current signal Ic1 and the current signal Ic2. Herein, the reason why the expression "substantially equal" is denoted is that a base current flows into the emitter to make an emitter current (the currents I1 and I2) larger than a collector current (the current signals Ic1 and Ic2) in a case where the transistors 31 and 32 are bipolar transistors as described below. For example, in a case where the transistors 31 and 32 are field effect transistors (MOSFET) having a MOS (Metal-Oxide-Semiconductor) structure, the gate current may be considered as zero. Therefore, the sum of the current I1 and the current I2 becomes equal to the sum of the current signal Ic1 and the current signal Ic2. The differential circuit 23 divides the sum of the current I1 and the current I2 into two parts in accordance with a difference between the voltage signal Vin and the reference signal Vref, and generates the current signal Ic1 and the current signal Ic2.

The transistors 31 and 32 are, for example, NPN-type bipolar transistors. The base (control terminal) of the transistor 31 is electrically connected to the output terminal of the TIA unit 11, and the voltage signal Vin is input to the base of the transistor 31 (or, the base of the transistor 31 receives the voltage signal Vin). The emitter (first current terminal) of the transistor 31 is electrically connected to the current source 21. The collector (second current terminal) of the transistor 31 is electrically connected to the differential circuit 25, and outputs the current signal Ic1. The base (control terminal) of the transistor 32 is electrically connected to the output terminal of the dummy TIA unit 12, and the reference signal Vref is input to the base of the transistor 32 (or, the base of the transistor 32 receives the reference signal Vref). The emitter (first current terminal) of the transistor 32 is electrically connected to the current source 22. The collector (second current terminal) of the transistor 32 is electrically connected to the differential circuit 26, and outputs the current signal Ic2.

The variable resistance circuit 33 is provided between the emitter of the transistor 31 and the emitter of the transistor 32, and is used to set the resistance value (the resistance value of the variable resistance circuit 33) between the emitter of the transistor 31 and the emitter of the transistor 32. The variable resistance circuit 33 includes a resistance element (resistor) 34 and a plurality (N; herein, N is an integer of 2 or more) of field effect transistors (FET) 35. Further, the N FETs 35 may be denoted by the FET 35_$k$ ($k$ is an integer of 1 or more and N or less) to distinguish each other. The resistor 34 has a fixed resistance value Re. One end of the resistor 34 is electrically connected to the emitter of the transistor 31, and the other end of the resistor 34 is electrically connected to the emitter of the transistor 32.

The respective FETs 35_1 to 35_N are connected in parallel with the resistor 34, and connected in parallel with each other. In other words, for example, the sources of the respective FETs 35_1 to 35_N are electrically connected to each other, and electrically connected to the emitter of the transistor 31 in common. The drains of the respective FETs 35_1 to 35_N are electrically connected to each other, and electrically connected to the emitter of the transistor 32 in common. Here, the sources may be connected to the emitter of the transistor 32 and the drains may be connected to the emitter of the transistor 31. A linearity adjustment signal Vctl is input to the gate of each of the FETs 35_1 to 35_N. The linearity adjustment signal Vctl is a control signal to control the linearity of the variable gain circuit 13. The linearity adjustment signal Vctl includes linearity adjustment signals Vctl_1 to Vctl_N. In other words, a linearity adjustment signal Vctl_$k$ is input to the gate of the FET 35_$k$.

The state of the FET 35_$k$ includes an ON state and an OFF state. The ON state is a conduction state at a relatively small resistance value (ON resistance value) between drain and source. The ON resistance value is, for example, about several tens $\Omega$ or less. The OFF state is a disconnected state between drain and source. The state of the FET 35_$k$ is switched between the ON state and the OFF state with the linearity adjustment signal Vctl_$k$. The FET 35_$k$ has a threshold voltage Vth_$k$. When the linearity adjustment signal Vctl_$k$ for the FET 35_$k$ is set to the threshold voltage Vth_$k$ on the basis of lower one of the voltage of the drain (drain voltage) and the voltage of the source (source voltage) of the FET 35_$k$, the FET 35_$k$ becomes an intermediate state between the OFF state and the ON state. The threshold voltage Vth_$k$ may be defined as a gate voltage for making the drain current equal to a predetermined value when the drain voltage is set to a predetermined value. In addition, the threshold voltage Vth_$k$ may be obtained as a result of fitting a model containing the threshold voltage Vth_$k$ to a current-voltage characteristic of the FET 35_$k$.

Therefore, herein, the ON state means a state in which a current value of current flowing from drain to source when a potential difference between the drain voltage and the source voltage is set to a predetermined value becomes equal to or more than a predetermined value (the current flows), or a state in which the resistance value between drain and source becomes equal to or less than a predetermined value (conductive) (in this case, the drain voltage and the source voltage may be equal). The ON resistance value is a resistance value between drain and source in the ON state. For example, a resistance value between drain and source when a voltage value of the linearity adjustment signal Vctl_k is set to a predetermined voltage value equal to or more than the threshold voltage Vth_k is called the ON resistance value. Further, herein, the drain voltage, the source voltage, and the voltage of the linearity adjustment signal Vctl_k are based on the same potential (for example, the ground potential). In this embodiment, the threshold voltages Vth_1 to Vth_N are equal to each other.

The FETs 35_1 to 35_N are different from each other in size. The size of the FET 35 is exemplarily obtained by dividing a gate width (channel width) W by a gate length (channel length) L, for example. The sizes of the FETs 35 becomes large in an order of the FET 35_1, the FET 35_2, ..., and the FET 35_N. In other words, the size of the FET 35_1 is the smallest, and the size of the FET 35_N is the largest. As the size of the FET 35 is decreased, the ON resistance value of the FET 35 is increased. Therefore, the ON resistance value of the FET 35 becomes small in an order of the FET 35_1, the FET 35_2, ..., and the FET 35_N. The ON resistance value of the FET 35_1 is the largest, and the ON resistance value of the FET 35_N is the smallest.

Further, the magnitude of the ON resistance value herein is described on an assumption that the same voltage is applied to the gates of the FET 35_1, the FET 35_2, ..., and the FET 35_N. In a case where the voltages (gate voltages) applied to the gates differ, the ON resistance value of the FET 35 is changed depending on the gate voltage. Therefore, a magnitude relation of the ON resistance values may be changed not only by the size of the FET 35 but also by the gate voltage. The resistance value (the resistance value of the variable resistance circuit 33) between the emitter of the transistor 31 and the emitter of the transistor 32 becomes a combined resistance value when the resistor 34 and the FETs 35_1 to 35_N are connected in parallel between drain and source of each of the FETs 35_1 to 35_N. The resistance value of the variable resistance circuit 33 affects gain of the variable gain circuit 13. For example, a larger resistance value of the variable resistance circuit 33 causes a smaller gain, and a smaller resistance value of the variable resistance circuit 33 causes a larger gain.

The differential amplifier 24 is a circuit which receives a gain adjustment signal Vga, and generates gain adjustment signals $Vga_+$ and $Vga_-$. The gain adjustment signal Vga is a control signal to control the gain of the variable gain circuit 13. The gain adjustment signals $Vga_+$ and $Vga_-$ are a pair of complementary signals. The phase (positive phase) of the positive signal $Vga_+$ and the phase (negative phase) of the negative signal $Vga_-$ are complementarily changed differently by 180 degrees. For example, when the positive signal $Vga_+$ is increased, the negative signal $Vga_-$ is decreased. When the positive signal $Vga_+$ is decreased, the negative signal $Vga_-$ is increased. In addition, when the positive signal $Vga_+$ reaches a peak value (maximum value), the negative signal $Vga_-$ reaches a bottom value (minimum value). When the positive signal $Vga_+$ reaches the bottom value, the negative signal $Vga_-$ reaches the peak value. The gain of the output signals Vout1 and Vout2 with respect to the voltage signal Vin of the variable gain circuit 13 is controlled by a potential difference between the gain adjustment signals $Vga_+$ and $Vga_-$. The differential amplifier 24 outputs the gain adjustment signals $Vga_+$ and $Vga_-$ to the differential circuit 25 and the differential circuit 26.

The differential circuit 25 is a circuit which divides the current signal Ic1 into a current signal Ic3 (third current signal) and a current signal Ic4 (fourth current signal) in accordance with the gain adjustment signal Vga. The differential circuit 25 includes a transistor 51 and a transistor 52.

The transistors 51 and 52 are, for example, NPN-type bipolar transistors. The base of the transistor 51 is electrically connected to an inverting output terminal of the differential amplifier 24, and the gain adjustment signal $Vga_-$ is input to the base of the transistor 51. The base of the transistor 52 is electrically connected to a non-inverting output terminal of the differential amplifier 24, and the gain adjustment signal $Vga_+$ is input to the base of the transistor 52. The emitter of the transistor 51 and the emitter of the transistor 52 are electrically connected to each other, and electrically connected to the collector of the transistor 31. The collector of the transistor 51 is electrically connected to a supply voltage VCC. The collector of the transistor 52 is electrically connected to the supply voltage VCC through the load element 27.

The differential circuit 26 is a circuit which divides the current signal Ic2 into a current signal Ic5 (fifth current signal) and a current signal Ic6 (sixth current signal) in accordance with the gain adjustment signal Vga. The differential circuit 26 includes a transistor 61 and a transistor 62.

The transistors 61 and 62 are, for example, NPN-type bipolar transistors. The base of the transistor 61 is electrically connected to the inverting output terminal of the differential amplifier 24, and the gain adjustment signal $Vga_-$ is input to the base of the transistor 61. The base of the transistor 62 is electrically connected to the non-inverting output terminal of the differential amplifier 24, and the gain adjustment signal $Vga_+$ is input to the base of the transistor 62. The emitter of the transistor 61 and the emitter of the transistor 62 are electrically connected to each other, and are electrically connected to the collector of the transistor 32. The collector of the transistor 61 is electrically connected to the supply voltage VCC. The collector of the transistor 62 is electrically connected to the supply voltage VCC through the load element 28.

The differential circuit 25 divides the current signal Ic1 into the current signal Ic3 and the current signal Ic4 in accordance with the gain adjustment signals $Vga_+$ and $Vga_-$. The current signal Ic3 is the collector current of the transistor 51. The current signal Ic4 is the collector current of the transistor 52. The differential circuit 26 divides the current signal Ic2 into the current signal Ic5 and the current signal Ic6 in accordance with the gain adjustment signals $Vga_+$ and $Vga_-$. The current signal Ic5 is the collector current of the transistor 61. The current signal Ic6 is the collector current of the transistor 62. In the variable gain circuit 13, the differential circuits 25 and 26 are configured such that the ratio of the current signal Ic4 to the current signal Ic3 is equal to the ratio of the current signal Ic6 to the current signal Ic5.

The load element 27 generates the output signal Vout1 (one of the pair of complementary signals) on the basis of the current signal Ic1. In this embodiment, the load element 27 converts the current signal Ic4 into the output signal Vout1. Specifically, the collector potential of the transistor 52 which is generated by the current signal Ic4 flowing to the load element 27 is output as the output signal Vout1. The load element 28 generates the output signal Vout2 (the other one of the pair of complementary signals) on the basis of the current signal Ic2. In this embodiment, the load element 28 converts the current signal Ic6 into the output signal Vout2. Specifically, the collector potential of the transistor 62 which is generated by the current signal Ic6 flowing to the load element 28 is output as the output signal Vout2.

A reference potential of the output signals Vout1 and Vout2 is equal to the supply voltage VCC to which the load elements 27 and 28 are connected. In other words, when the current signal Ic4 is zero, the potential of the output signal Vout1 becomes equal to the supply voltage VCC. When the current signal Ic4 flows in the load element 27, the potential of the output signal Vout1 becomes a potential lower than the supply voltage VCC by a voltage drop (the resistance value of the load element 27×a magnitude of the current signal Ic4) of the load element 27. Similarly, when the current signal Ic6 is zero, the potential of the output signal Vout2 becomes equal to the supply voltage VCC. When the current signal Ic6 flows in the load element 28, the potential of the output signal Vout2 becomes a potential lower than the supply voltage VCC by a voltage drop (the resistance value of the load element 28×a magnitude of the current signal Ic6) of the load element 28. The resistance values of the load elements 27 and 28 are normally set to the same value in many cases. In that case, the output signal Vout1 and the output signal Vout2 constitute one differential signal.

Making an explanation on an assumption that a high voltage state (high level) corresponds to binary data "1" and a low voltage state (low level) corresponds to binary value "0", the output signal Vout1 becomes "0", and the output signal Vout2 becomes "1" when the voltage signal Vin is "1". At this time, the variable gain circuit 13 performs an inverting amplification. Further, since the circuit structure of the variable gain circuit 13 is symmetrical, the variable gain circuit 13 operates similarly even when the output signal Vout1 and the output signal Vout2 are reversed. However, in a case where the output signal Vout1 and the output signal Vout2 are replaced with each other, the output signal Vout1 becomes "1", and the output signal Vout2 becomes "0" when the voltage signal Vin is "1". Therefore, the variable gain circuit 13 performs a non-inverting amplification. In this way, in a case where the positive component and the negative component of the differential signal are reversed, the logic of the differential signal is inverted. This only has a meaning (effect) that the signal is logically inverted. In principle, there is no essential difference in function and operation characteristic as a circuit. Further, in FIG. 1, the variable gain circuit 13 is illustrated as a circuit which performs a non-inverting amplification.

The buffer 14 is a differential amplifier which amplifies the output signals Vout1 and Vout2, and outputs the output signals Voutx1 and Voutx2. At this time, for example, a difference (=Voutx1−Voutx2) between the output signal Voutx1 and the output signal Voutx2 becomes equal to a magnitude obtained by multiplying a difference (=Vout1−Vout2) between the output signal Vout1 and the output signal Vout2 by the gain (differential gain) of the buffer 14. The output buffer 15 is a differential amplifier that further amplifies the output signals Voutx1 and Voutx2 amplified by the buffer 14, and outputs the output signals DoutP and DoutN. At this time, for example, a difference (=DoutP−DoutN) of the output signal DoutP and the output signal DoutN becomes equal to a magnitude obtained by multiplying a difference (=Voutx1−Voutx2) between the output signal Voutx1 and the output signal Voutx2 by the gain (differential gain) of the output buffer 15. The gains of the buffer 14 and the output buffer 15 are set to fixed values set in advance.

Further, in FIG. 1, the variable gain circuit 13, the buffer 14, and the output buffer 15 are all configured to perform a non-inverting amplification. However, in a case where these circuits are configured by a differential circuit, there is no difference between output signals in principle even when the non-inverting amplifier is connected to the non-inverting amplifier in a cascade manner, or even when the non-inverting amplifier configured by switching the positive component and the negative component of the differential signal of the non-inverting amplifier is connected, in a cascade manner, to the non-inverting amplifier configured similarly. Therefore, the circuit structure is exactly equivalent.

The offset control circuit 16 is a circuit which generates a control signal Voffset in accordance with the output signals DoutP and DoutN which are output from the output buffer 15. The control signal Voffset is a signal to control a temporal average value of the current signal Iin to be a predetermined value. The offset control circuit 16 outputs the control signal Voffset to the bypass circuit 17. The offset control circuit 16 controls the bypass circuit 17 such that, for example, average voltage of the voltage signal Vin approaches the reference signal Vref for reducing a difference (offset) between average voltages of the output signal DoutP and the output signal DoutN. Therefore, it is suppressed that the temporal average value of the current signal Iin is excessively increased.

The bypass circuit 17 is a circuit which subtracts the bypass current Ib from the input current signal Din in accordance with the control signal Voffset. In this embodiment, the bypass circuit 17 includes an FET. The gate of the FET is electrically connected to the output terminal of the offset control circuit 16, and the control signal Voffset is supplied to the gate of the FET. The source of the FET is electrically connected to the ground potential. The drain of the FET is electrically connected to the input terminal 10$a$. The bypass circuit 17 changes the magnitude of the bypass current Ib in accordance with the control signal Voffset. However, the bypass circuit 17 is not limited to the configuration illustrated in FIG. 1, and may have other circuit structures to realize the same functions.

The gain control circuit 18 is a circuit which generates the gain adjustment signal Vga on the basis of the amplitudes of the output signals Vout1 and Vout2 (the output signals Voutx1 and Voutx2). The gain control circuit 18 adjusts the gain of the variable gain circuit 13 by controlling the current signal Ic4 and the current signal Ic6 using the gain adjustment signal Vga. The gain control circuit 18 generates the gain adjustment signal Vga such that the gain of the variable gain circuit 13 becomes smaller as the amplitudes of the output signals Vout1 and Vout2 are increased. In this example, the gain control circuit 18 generates the gain adjustment signal Vga such that the voltage level of the gain adjustment signal Vga becomes smaller as the amplitudes of the output signals Vout1 and Vout2 are increased. Further, for example, in the configuration illustrated in FIG. 2, the potential difference ($Vga_+ - Vga_-$) between the gain adjustment signals $Vga_+$ and $Vga_-$ output from the differential amplifier 24 becomes small when the voltage level of the gain adjustment signal Vga becomes small.

As illustrated in FIG. 3, the gain control circuit 18 includes an amplitude detection circuit 81 (first amplitude detection circuit) and a generation circuit 82 (first generation circuit). The amplitude detection circuit 81 is a circuit which detects amplitudes of the output signals Vout1 and Vout2. Specifically, the amplitude detection circuit 81 detects amplitudes of the output signals Voutx1 and Voutx2 which are amplified by the buffer 14. For example, if a voltage gain of the buffer 14 is set to a predetermined value when the generation circuit 82 performs a linear amplifying operation, the amplitudes of the output signals Voutx1 and Voutx2 are divided by the voltage gain of the buffer 14 to obtain the amplitudes of the output signals Vout1 and Vout2. The amplitude detection circuit 81 includes a peak detection circuit 83, an average detection circuit 84, and a differential amplifier 85.

The peak detection circuit 83 is a circuit to detect the peak values of the output signals Voutx1 and Voutx2. The peak detection circuit 83 outputs the detected peak value to the differential amplifier 85. The average detection circuit 84 is a circuit to detect temporal average values (average voltage values) of the output signals Voutx1 and Voutx2. The average detection circuit 84 outputs the detected average value to the differential amplifier 85. The differential amplifier 85 generates a difference between the peak value detected by the peak detection circuit 83 and the average value detected by the average detection circuit 84, and detects the amplitudes of the output signals Voutx1 and Voutx2 on the basis of the difference. The peak value is input to a non-inverting input terminal of the differential amplifier 85, and the average value is input to an inverting input terminal of the differential amplifier 85. The differential amplifier 85 detects the amplitude from a value (equal to ½ of the amplitude) obtained by subtracting the average value from the peak value. The differential amplifier 85 outputs the detected amplitude to the generation circuit 82.

The generation circuit 82 is a circuit which generates the gain adjustment signal Vga on the basis of the amplitudes of the output signals Voutx1 and Voutx2. In this example, the generation circuit 82 is a differential amplifier. The amplitude output from the amplitude detection circuit 81 is input to an inverting input terminal of the generation circuit 82. A reference signal Aref is input to a non-inverting input terminal of the generation circuit 82. The reference signal Aref is a predetermined setting value, and is set such that the signals of the buffer 14 and the output buffer 15 are not distorted in the range of the optical signal Pin. At this time, the gain (differential gain) of the generation circuit 82 may be set appropriately. The generation circuit 82 generates the gain adjustment signal Vga by amplifying the value which is obtained by subtracting the amplitude from the reference signal Aref. According to the configuration, the value of the gain adjustment signal Vga becomes smaller as the amplitudes of the output signals Voutx1 and Voutx2 are increased. The generation circuit 82 outputs the gain adjustment signal Vga to the variable gain circuit 13.

The linearity control circuit 19 is a circuit which generates the linearity adjustment signal Vctl on the basis of the amplitude of the voltage signal Vin. Specifically, the linearity control circuit 19 supplies the linearity adjustment signal Vctl to the FETs 35_1 to 35_N such that the resistance value of the variable resistance circuit 33 becomes larger as the amplitude of the voltage signal Vin is larger. For example, the linearity control circuit 19 performs the control to decrease the differential gain of the variable gain circuit 13 by increasing the resistance value of the variable resistance circuit 33, and thus the variable gain circuit 13 performs the linear amplifying operation. Herein, the linear amplifying operation is an operation in which the difference between the voltage signal Vin and the reference signal Vref is amplified by a predetermined differential gain when the voltage signal Vin is changed within a certain voltage range. The differential gain of the variable gain circuit 13 is increased when the resistance value of the variable resistance circuit 33 is decreased. Therefore, if the difference between the voltage signal Vin and the reference signal Vref exceeds a predetermined range, the amplifying operation of the variable gain circuit 13 is saturated, and the output signals Vout1 and Vout2 are distorted. Increasing the resistance value of the variable resistance circuit 33 prevents the output signals Vout1, Vout2 from being saturated and distorted against a large difference between the voltage signal Vin and the reference signal Vref. Accordingly, properly adjusting the linearity adjustment signals Vctl_1 to Vctl_N allows the variable gain circuit 13 to secure the linearity.

The resistance value of the variable resistance circuit 33 is a resistance value between the emitter of the transistor 31 and the emitter of the transistor 32. In this embodiment, the linearity control circuit 19 generates the linearity adjustment signals Vctl_1 to Vctl_N of which the voltage levels are different from each other, and supplies the linearity adjustment signals Vctl_1 to Vctl_N to the FETs 35_1 to 35_N respectively. Each of the linearity adjustment signals Vctl_1 to Vctl_N is an analog signal. The voltage levels of the linearity adjustment signals Vctl_1 to Vctl_N are set in an order of the linearity adjustment signal Vctl_1, the linearity adjustment signal Vctl_2, . . . , and the linearity adjustment signal Vctl_N such that the voltage level of the linearity adjustment signal Vctl becomes small. In other words, the voltage level of the linearity adjustment signal Vctl_1 is the largest, and the voltage level of the linearity adjustment signal Vctl_N is the smallest.

As illustrated in FIG. 4, the linearity control circuit 19 compares a detection signal Vdet corresponding to the magnitude of the amplitude of the voltage signal Vin with a predetermined setting value (reference signal Bref), and generates the linearity adjustment signals Vctl_1 and Vctl_2. Further, while the number of FETs 35 included in the variable resistance circuit 33 has been described above as "N", the description will be given about the case of N=2 for the sake of convenience of explanation. The linearity control circuit 19 includes a comparator circuit 90, a current mirror circuit 70, a resistance element 98_1, and a resistance element 98_2.

The comparator circuit 90 includes a transistor 91, a transistor 92, a transistor 93, a transistor 94, a current source 95, a resistance element 96, and a resistance element 97. The transistors 91 and 92 are, for example, N-type MOSFETs. The transistors 91 and 92 are a pair of transistors (transistor pair) which have the same structure and the same electrical characteristics. The source of the transistor 91 is connected to the current source 95 through the resistance element 96. The source of the transistor 92 is connected to the current source 95 through the resistance element 97. The current source 95 supplies a constant amount of current to the transistors 91 and 92.

The reference signal Bref is applied to the gate of the transistor 91. The detection signal Vdet is input to the gate of the transistor 92. The detection signal Vdet has a voltage corresponding to the amplitude of the voltage signal Vin. For example, the detection signal Vdet is generated by inputting the output (the peak value of the voltage signal Vin) of a peak detection circuit (not illustrated) and the output (the average value of the voltage signal Vin) of an average detection circuit (not illustrated) to a differential amplifier (not illustrated) similarly to the amplitude detection circuit

81. Herein, it is assumed that the voltage of the detection signal Vdet is increased as the amplitude of the voltage signal Vin is increased.

The transistors 91 and 92 divide the current supplied by the current source 95 into the drain currents of the transistors 91 and 92 in accordance with the detection signal Vdet and the reference signal Bref. For example, in a case where the voltage of the detection signal Vdet is smaller than the voltage of the reference signal Bref, the drain current of the transistor 91 becomes larger than the drain current of the transistor 92. On the other hand, in a case where the voltage of the detection signal Vdet is larger than the voltage of the reference signal Bref, the drain current of the transistor 91 becomes smaller than the drain current of the transistor 92. In a case where the voltage of the detection signal Vdet is equal to the voltage of the reference signal Bref, the drain currents of the transistors 91 and 92 become equal to each other, and the current supplied by the current source 95 is equally divided and flows.

The sum of the drain currents of the transistors 91 and 92 is equal to a certain amount of current supplied by the current source 95. Therefore, when the voltage of the detection signal Vdet is increased, the drain current of the transistor 91 is decreased. When the voltage of the detection signal Vdet is decreased, the drain current of the transistor 91 is increased. In this way, by appropriately setting the value of the reference signal Bref, it is possible to decrease the drain current of the transistor 91 in response to the amplitude of the voltage signal Vin being increased.

The transistors 93 and 94 work as load transistors. The transistors 93 and 94 are, for example, P-type MOSFETs. The transistors 93 and 94 are a pair of transistors (transistor pair) which have the same structure and the same electrical characteristics. The gate and the drain of the transistor 93 are connected to each other, and electrically connected to the drain of the transistor 91. In other words, the drain current of the transistor 93 is equal to the drain current of the transistor 91. The gate and the drain of the transistor 94 are connected to each other, and electrically connected to the drain of the transistor 92. In other words, the drain current of the transistor 94 is equal to the drain current of the transistor 92. The sources of the transistors 93 and 94 are electrically connected to the supply voltage VCC.

The current mirror circuit 70 includes the transistor 93, an output transistor 71_1, and an output transistor 71_2. In other words, the transistor 93 is included in both of the comparator circuit 90 and the current mirror circuit 70. The transistor 93 serves as an input transistor in the current mirror circuit 70. The output transistors 71_1 and 71_2 are, for example, P-type MOSFETs. The gates of the output transistors 71_1 and 71_2 are electrically connected to the gate and the drain of the transistor 93. The sources of the output transistors 71_1 and 71_2 are electrically connected to the supply voltage VCC. The drain of the output transistor 71_1 is electrically connected to the ground potential through the resistance element 98_1. The drain of the output transistor 71_2 is electrically connected to the ground potential through the resistance element 98_2. The resistance element 98_1 has a resistance value R1. The resistance element 98_2 has a resistance value R2.

The transistor 93 and the output transistor 71_1 constitute a first current mirror circuit. For example, an output current (drain current) Id1 which is proportional to the magnitude of the drain current (input current) of the transistor 93 is output from the output transistor 71_1. When an output current Id1 flows to the resistance element 98_1, a voltage (drain voltage) equal to a voltage obtained by the resistance value R1×(the current value of) the output current Id1 is generated in the drain of the output transistor 71_1 by a voltage drop of the resistance element 98_1. The linearity control circuit 19 outputs the drain voltage of the output transistor 71_1 as the linearity adjustment signal Vctl_1.

Similarly, the transistor 93 and the output transistor 71_2 constitute a second current mirror circuit. For example, an output current (drain current) Id2 which is proportional to the magnitude of the drain current (input current) of the transistor 93 is output from the output transistor 71_2. When an output current Id2 flows to the resistance element 98_2, a voltage (drain voltage) equal to a voltage obtained by the resistance value R2×(the current value of) the output current Id2 is generated in the drain of the output transistor 71_2 by a voltage drop of the resistance element 98_2. The linearity control circuit 19 outputs the drain voltage of the output transistor 71_2 as the linearity adjustment signal Vctl_2.

When the ratio (current ratio) of the input current and the output current of each of the first current mirror circuit and the second current mirror circuit, and the resistance value of each of the resistance elements 98_1 and 98_2 are appropriately set, the voltage of each of the linearity adjustment signals Vctl_1 and Vctl_2 is set such that the voltage value of the linearity adjustment signal Vctl_1 becomes larger than the voltage value of the linearity adjustment signal Vctl_2.

When the amplitude of the voltage signal Vin is increased, the voltage of the detection signal Vdet input to the gate of the transistor 92 is increased, and the drain current flowing in the transistor 93 is decreased in the comparator circuit 90. Then, since the input current flowing in the transistor 93 is decreased, the output currents Id1 and Id2 are decreased in the current mirror circuit 70. When the output currents Id1 and Id2 are decreased, the voltages of the linearity adjustment signals Vctl_1 and Vctl_2 are decreased. Therefore, when the amplitude of the voltage signal Vin is increased, the voltages of the linearity adjustment signals Vctl_1 and Vctl_2 are decreased.

On the other hand, when the amplitude of the voltage signal Vin is decreased, the voltage of the detection signal Vdet input to the gate of the transistor 92 is decreased, and the drain current flowing in the transistor 93 is increased in the comparator circuit 90. Then, the input current flowing in the transistor 93 is increased, so that the output currents Id1 and Id2 are also increased in the current mirror circuit 70. When the output currents Id1 and Id2 are increased, the voltages of the linearity adjustment signals Vctl_1 and Vctl_2 are increased. Therefore, when the amplitude of the voltage signal Vin is decreased, the voltages of the linearity adjustment signals Vctl_1 and Vctl_2 are increased.

Further, in this way, when the voltages of the linearity adjustment signals Vctl_1 and Vctl_2 are increased or decreased in accordance with the amplitude of the voltage signal Vin, the output currents Id1 and Id2 are varied with a constant rate to each other since the input current is shared in the first current mirror circuit and the second current mirror circuit. With this configuration, for example, the linearity adjustment signals Vctl_1 and Vctl_2 are set to always establish a relation that the voltage value of the linearity adjustment signal Vctl_1 is larger than the voltage value of the linearity adjustment signal Vctl_2.

FIG. 4 illustrates the case of N=2 for example. Even in a case where "N" is larger than "2", the current mirror circuit 70 may include N current mirror circuits similarly to the first current mirror circuit and the second current mirror circuit, and the linearity control circuit 19 may include a resistance element at the output of each current mirror circuit. With this configuration, the output current from each current mirror circuit flows to the resistance element. Therefore, N linearity adjustment signals Vctl_1 to Vctl_N are generated to satisfy a relation that the voltage values become small in an order of the linearity adjustment signal Vctl_1, the linearity adjustment signal Vctl_2, . . . , and the linearity adjustment signal Vctl_N. When the voltage value of each linearity adjustment signal Vctl_k is represented by Vctl_k for the sake of convenience of explanation, N linearity adjustment signals Vctl_1 to Vctl_N are generated to satisfy the relation of Vctl_1>Vctl_2> . . . >Vctl_N.

As described above, since the threshold voltages Vth_1 to Vth_N are equal to each other, the FETs are switched from the OFF state to the ON state in an order of the FET 35_1, the FET 35_2, . . . , and the FET 35_N in a case where the resistance value of the variable resistance circuit 33 is set smaller. On the other hand, in a case where the resistance value of the variable resistance circuit 33 is set larger, the FETs are switched from the ON state to the OFF state in an order of the FET 35_N, . . . , the FET 35_2, and the FET 35_1. In other words, timings that the voltage levels of the linearity adjustment signals Vctl_1 to Vctl_N reach the threshold voltages Vth_1 to Vth_N are different from each other.

Figure 5:
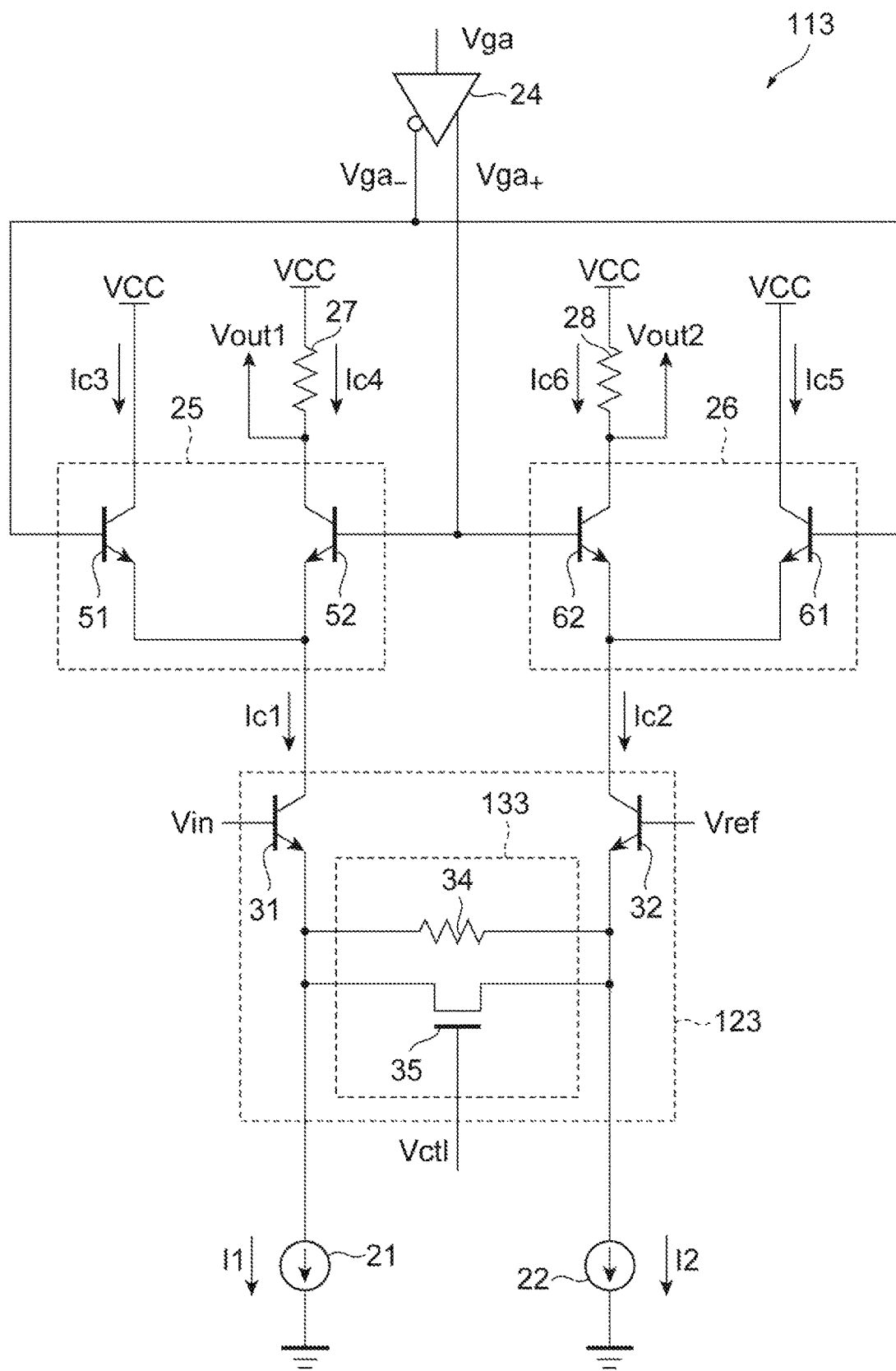
FIG. 5 is a diagram illustrating a circuit structure of a variable gain circuit which is included in a transimpedance amplifier of a comparative example.

Next, the operational effects of the transimpedance amplifier 10 and the variable gain circuit 13 will be described while comparing to a transimpedance amplifier of a comparative example with reference to FIGS. 5 to 7B. FIG. 5 is a diagram illustrating a circuit structure of a variable gain circuit which is included in the transimpedance amplifier of the comparative example.

As illustrated in FIG. 5, a variable gain circuit 113 of the comparative example is mainly different from the variable gain circuit 13 in that the differential circuit 123 is provided instead of the differential circuit 23. The differential circuit 123 is mainly different from the differential circuit 23 in that a variable resistance circuit 133 is provided instead of the variable resistance circuit 33. The variable resistance circuit 133 is mainly different from the variable resistance circuit 33 in that one FET 35 is provided instead of the FETs 35_1 to 35_N.

In the transimpedance amplifier used in the variable gain circuit 113, the linearity control circuit outputs the linearity adjustment signal Vctl which has an analog value to the FET 35. In other words, the linearity control circuit sets the voltage level of the linearity adjustment signal Vctl to be large as the amplitude of the voltage signal Vin is small so as to make the resistance value of the variable resistance circuit 133 (the FET 35) small. As the amplitude of the voltage signal Vin is large, the linearity control circuit sets the voltage level of the linearity adjustment signal Vctl to be small so as to make the resistance value of the variable resistance circuit 133 (the FET 35) large.

Figure 6:
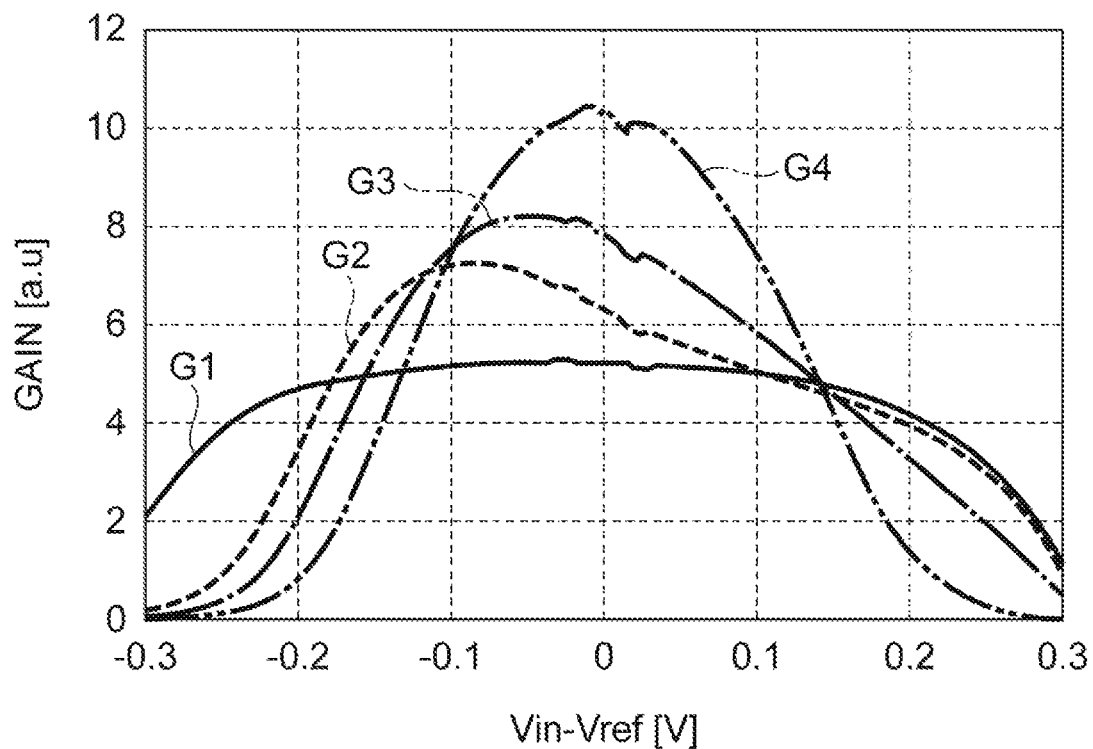
FIG. 6 is a diagram illustrating direct current (DC) characteristics of the variable gain circuit illustrated in FIG. 5.
Figure 7A:
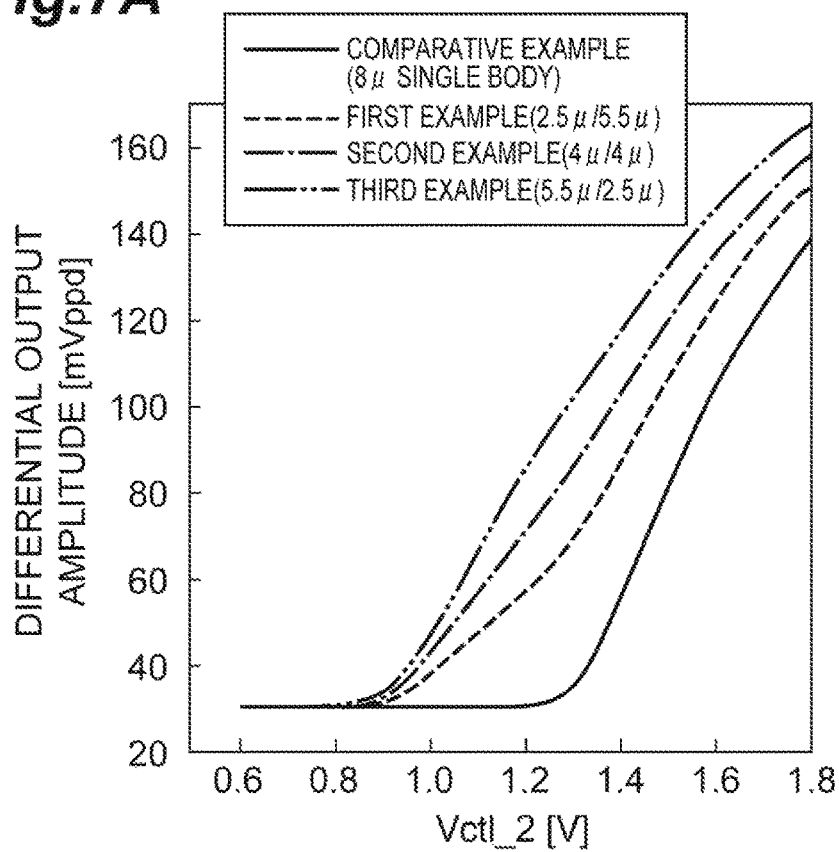
FIG. 7A is a diagram illustrating a simulation result of amplitude of an output waveform with respect to a linearity adjustment signal of the transimpedance amplifier.
Figure 7B:
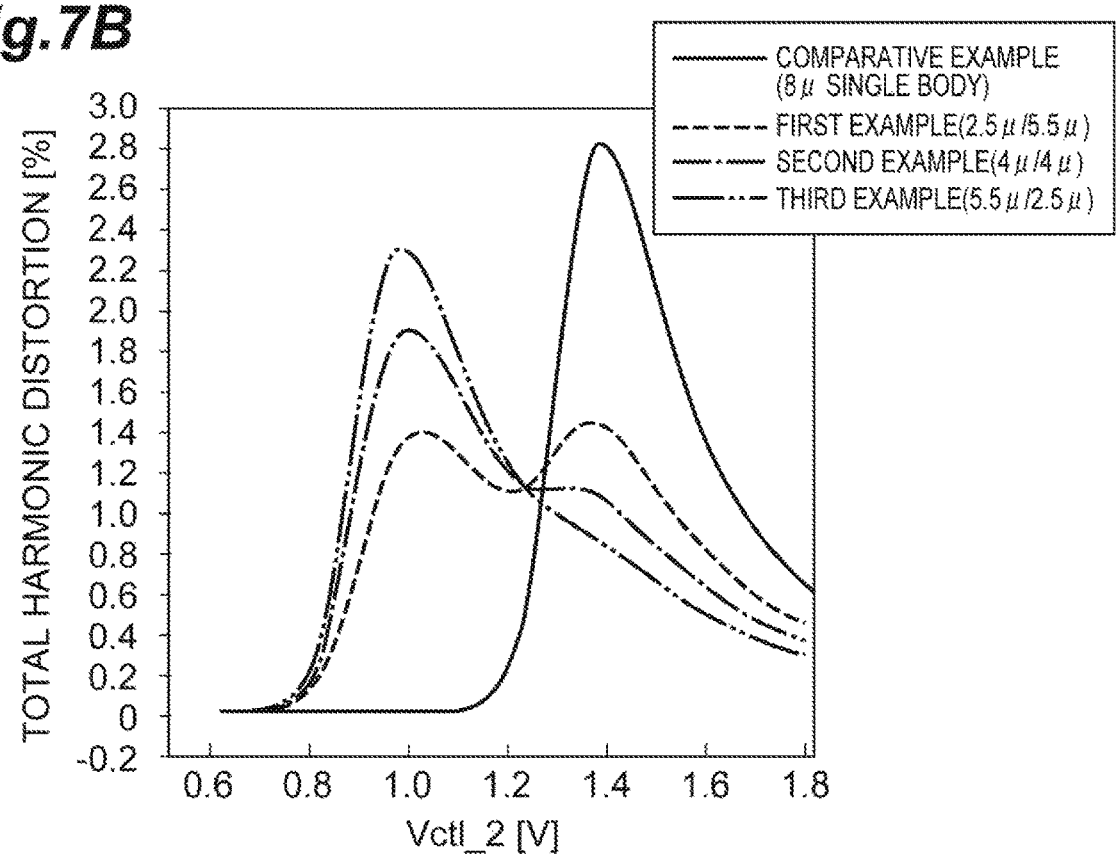
FIG. 7B is a diagram illustrating a simulation result of a total harmonic distortion of the output waveform with respect to the linearity adjustment signal of the transimpedance amplifier.

FIG. 6 is a diagram illustrating DC characteristics of the variable gain circuit illustrated in FIG. 5. FIG. 7A is a diagram illustrating a simulation result of amplitude of an output waveform with respect to a linearity adjustment signal of the transimpedance amplifier. FIG. 7B is a diagram illustrating a simulation result of a total harmonic distortion of the output waveform with respect to the linearity adjustment signal of the transimpedance amplifier. The horizontal axis of FIG. 6 represents a differential input voltage (=Vin−Vref) [V] which is the difference between the voltage signal Vin and the reference signal Vref. The vertical axis of FIG. 6 represents a differential gain [a.u.] of the variable gain circuit 113. Further, "a.u." means an arbitrary unit. The horizontal axis of FIGS. 7A and 7B represents a voltage value [V] of the linearity adjustment signal Vctl_2. The vertical axis of FIG. 7A represents amplitude [mVppd] of the output waveform. The vertical axis of FIG. 7B represents a total harmonic distortion (THD) [%] of the output waveform. Further, the total harmonic distortion illustrated in FIG. 7B shows a total harmonic distortion in the variable gain circuits 13 and 113.

Herein, as the voltage signal Vin, there is shown the total harmonic distortions of the output signals Vout1 and Vout2 which are output from the variable gain circuits 13 and 113 in the case of a sinusoidal wave having amplitude of 50 mVpp and a frequency of 1 GHz. Further, in a case where there is used a sinusoidal wave having a frequency of 1 GHz as the voltage signal Vin, only the frequency component of 1 GHz is left in frequency spectrums of the output signals Vout1 and Vout2 output from the variable gain circuits 13 and 113 in an ideal state where there is no distortion. When the distortion becomes large, the frequency component (harmonics) having an integer multiple of 1 GHz is increased.

Further, in a simulation of FIGS. 7A and 7B, two FETs are used as the FET 35 of the variable gain circuit 13 (that is, N=2), and a single FET is used as the FET 35 of the variable gain circuit 113. The gate width W of the FET 35 of the variable gain circuit 113 is 8 μm (comparative example), and combinations of the gate widths W of two FETs 35 (the FET 35_1 and the FET 35_2) of the variable gain circuit 13 are 2.5 μm/5.5 μm (first example), 4 μm/4 μm (second example), and 5.5 μm/2.5 μm (third example). Herein, the first example, the second example, and the third example all are the names to distinguish the combinations of the gate widths W of two FETs 35 (the FET 35_1 and the FET 35_2) of the variable gain circuit 13 in the first embodiment.

In the respective examples, a total sum of the gate widths W of two FETs 35 of the variable gain circuit 13 is equal to the gate width W of the single FET 35 of the variable gain circuit 113. The gate length L of each FET 35 is 0.13 μm. As the linearity adjustment signal Vctl_1 supplied to the FET 35_1, there is used a signal obtained by adding 400 mV to the linearity adjustment signal Vctl_2 which is supplied to the FET 35_2. The linearity adjustment signal Vctl_2 is supplied to the single FET 35 of the variable gain circuit 113 as the linearity adjustment signal Vctl.

Graphs G1 to G4 of FIG. 6 illustrate DC characteristics of the variable gain circuit 113 on a bias condition in which the gate voltages of the FETs 35 are different. The voltage levels of the linearity adjustment signal Vctl become increased in an order of Graphs G1 to G4, and the gains (absolute value) become large. Specifically, on the bias condition of Graph G1, the voltage level of the linearity adjustment signal Vctl is sufficiently smaller than the threshold voltage of the FET 35, and the FET 35 of the variable resistance circuit 133 is in the OFF state. The resistance value of the variable resistance circuit 133 at this time is equal to the resistance value of the resistor 34. On the bias conditions of Graphs G2 and G3, the voltage level of the linearity adjustment signal Vctl is near the threshold voltage of the FET 35. At this time, the resistance value of the FET 35 is lowered, and the gain of the variable gain circuit 113 becomes large. However, the slopes of Graphs G2 and G3 are large when the differential input voltage is "0". In other words, the gains in Graphs G2 and G3 are asymmetrical in the positive and negative differential input voltages. Therefore, the positive amplitude and the negative amplitude of the output signals Vout1 and Vout2 are different. Therefore, as illustrated in FIG. 7B, a peak distortion becomes large and the linearity is degraded in the comparative example.

On the bias condition of Graph G4, the voltage level of the linearity adjustment signal Vctl is sufficiently larger than the threshold voltage of the FET 35. Therefore, terminal voltages (the source voltage and the drain voltage) of the FET 35 has less influence on the resistance value of the FET 35, and the asymmetry is improved.

On the other hand, in the first to third examples, since the linearity adjustment signal Vctl_1 is larger than the linearity adjustment signal Vctl_2, the linearity adjustment signal Vctl_1 gets first close to the threshold voltage Vth_1 of the FET 35_1, and the linearity adjustment signal Vctl_2 gets close to the threshold voltage Vth_2 of the FET 35_2. Therefore, the FET 35_1 and the FET 35_2 are switched from the OFF state to the ON state in this order. With this configuration, as illustrated in FIG. 7B, in the first to third examples, a peak distortion is suppressed compared to the comparative example. In addition, as illustrated in FIG. 7A, in the first to third examples, the amplitudes of the output signals Vout1 and Vout2 are slowly increased together with an increase of the linearity adjustment signal Vctl_2 compared to the comparative example. As described above, since the amplitude of the voltage signal Vin is fixed to 50 mVpp, the changes in the amplitudes of the output signals Vout1 and Vout2 can be considered as a change in gain (differential gain). Therefore, the gains (differential gains) of the comparative example, the third example, the second example, and the first example are slowly changed in this order with respect to the linearity adjustment signals Vctl_1 and Vctl_2 (the slopes of the respective curves are compared).

In addition, as illustrated in FIG. 7B, comparing the first to third examples, it can be seen that the size (the gate width W) of the FET 35_1 first switched to the ON state affects a reduction of the peak distortion. As described in the first example, when the FET 35 having a small size (the gate width W) is first switched to the ON state, the resistance value of the variable resistance circuit 33 is slowly changed. Therefore, it is possible to decrease the peak distortion still more. This can be analogized because, for example, in two resistance elements connected in parallel to each other, the change of the resistance value of the resistance element having a larger resistance value has less influence on the combined resistance value of the two resistance elements compared to the change of the resistance value of the resistance element having a smaller resistance value.

As described above, in the transimpedance amplifier 10 and the variable gain circuit 13, the voltage signal Vin is input to the base of the transistor 31 included in the differential circuit 23, and the reference signal Vref is supplied to the base of the transistor 32. In such an asymmetrical configuration, if the FET 35 is particularly in a transition state such as the transimpedance amplifier of the comparative example, the variation of the terminal voltages of the source and the drain affects the resistance value between the source and drain. There is a concern that the linearity of the output signals Vout1 and Vout2 with respect to the voltage signal Vin is degraded. With this regard, in the transimpedance amplifier 10 and the variable gain circuit 13, the linearity adjustment signals Vctl_1 to Vctl_N are supplied to the gates of the FETs 35_1 to 35_N respectively, so that the resistance value of the variable resistance circuit 33 is set. Each FET 35_k enters the transition state when the voltage of the linearity adjustment signal Vctl_k supplied to the gate gets close to the threshold voltage Vth_k. In the transimpedance amplifier 10 and the variable gain circuit 13, the timings that the linearity adjustment signals Vctl_1 to Vctl_N reach the threshold voltages Vth_1 to Vth_N are different from each other. Therefore, the resistance value of the variable resistance circuit 33 can be changed without causing two or more FETs 35 to enter the transition state at the same time. With this configuration, it is possible to stabilize the resistance value of the variable resistance circuit 33. As a result, it is possible to improve the linearity of the output signals Vout1 and Vout2 with respect to the voltage signal Vin.

In addition, since the linearity adjustment signals Vctl_1 to Vctl_N can be changed linearly (analogously), the circuit structure of the linearity control circuit 19 can be simplified.

The voltage level of the linearity adjustment signal Vctl is set such that the voltage levels of the linearity adjustment signal Vctl_1, the linearity adjustment signal Vctl_2, . . . , and the linearity adjustment signal Vctl_N become small in this order. With this configuration, it is possible to differently set timings for the linearity adjustment signals Vctl_1 to Vctl_N to reach the threshold voltages Vth_1 to Vth_N. With this configuration, it is possible to manufacture the FETs 35_1 to 35_N in the same process.

As the size of the FET 35 is decreased, the ON resistance value of the FET 35 is increased. The sizes of the FETs 35 becomes large in an order of the FET 35_1, the FET 35_2, . . . , and the FET 35_N. Therefore, for example, in a case where the resistance value of the variable resistance circuit 33 is set small, the FETs 35 are switched from the OFF state to the ON state in a descending order of the ON resistance value, so that the resistance value of the variable resistance circuit 33 is slowly changed. For example, when the FET 35_1 having the largest ON resistance value is switched to the ON state earlier than the other FETs 35, the resistance value of the variable resistance circuit 33 is slowly changed. In addition, in a case where the resistance value of the variable resistance circuit 33 is set large, the FETs 35 are switched from the ON state to the OFF state in an ascending order of the ON resistance value, so that the resistance value of the variable resistance circuit 33 is slowly changed. In other words, as the resistance value of the variable resistance circuit 33 becomes smaller, the change amount of the resistance value of the variable resistance circuit 33 is decreased. As the resistance value of the variable resistance circuit 33 becomes larger, the change amount of the resistance value of the variable resistance circuit 33 is increased. Therefore, a ratio of the change amount of the resistance value with respect to the resistance value of the variable resistance circuit 33 is uniformed as a whole. With this configuration, it is possible to stabilize the resistance value of the variable resistance circuit 33 still more. As a result, the linearity of the output signals Vout1 and Vout2 with respect to the voltage signal Vin can be improved still more.

A distribution ratio of dividing the current signal Ic1 into the current signal Ic3 and the current signal Ic4 and a distribution ratio of dividing the current signal Ic2 into the current signal Ic5 and the current signal Ic6 are adjusted by the gain adjustment signal Vga. With this configuration, the current signal Ic4 supplied to the load element 27 and the current signal Ic6 supplied to the load element 28 are adjusted. Therefore, it is possible to adjust the gains of the output signals Vout1 and Vout2 with respect to the voltage signal Vin.

The gain control circuit 18 generates the gain adjustment signal Vga on the basis of the amplitudes of the output signals Voutx1 and Voutx2. In other words, the gain adjustment signal Vga is generated using the output signals Voutx1 and Voutx2. With this configuration, for example, the gain of the variable gain circuit 13 can be adjusted such that the linearity of the amplification in the variable gain circuit 13 can be maintained. As a result, it is possible to expand the voltage range of the voltage signal Vin.

Further, in the variable gain circuit 13, the timings that the voltage levels of the linearity adjustment signals Vctl_1 to Vctl_N reach the threshold voltages Vth_1 to Vth_N may be different from each other. Therefore, in the variable gain circuit 13, the threshold voltages Vth_1 to Vth_N may be set to values different from each other. For example, the threshold voltages Vth_1 to Vth_N may be increased in this order.

Second Embodiment

Figure 8:
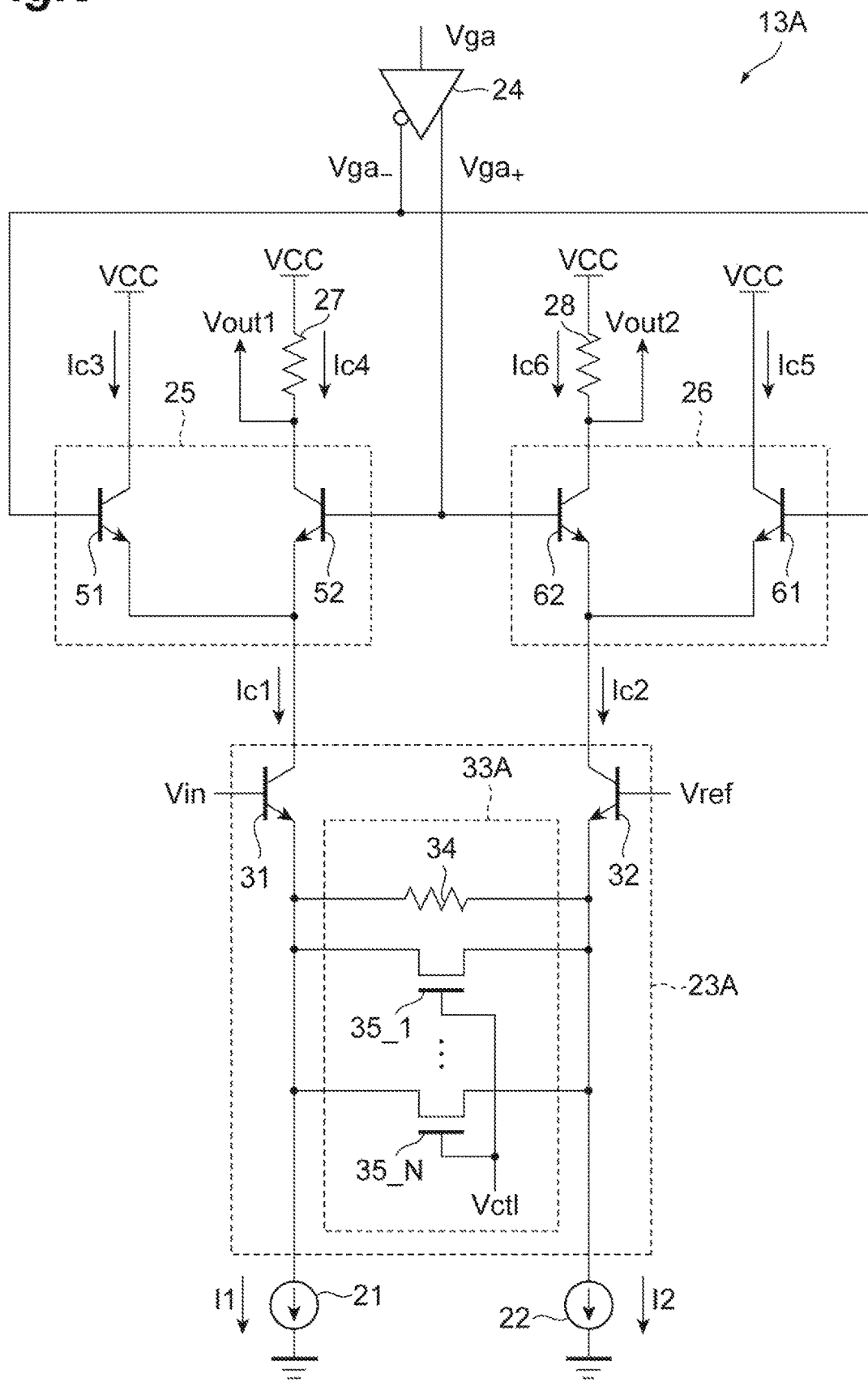
FIG. 8 is a diagram illustrating a circuit structure of a variable gain circuit which is included in a transimpedance amplifier of a second embodiment.
Figure 9:
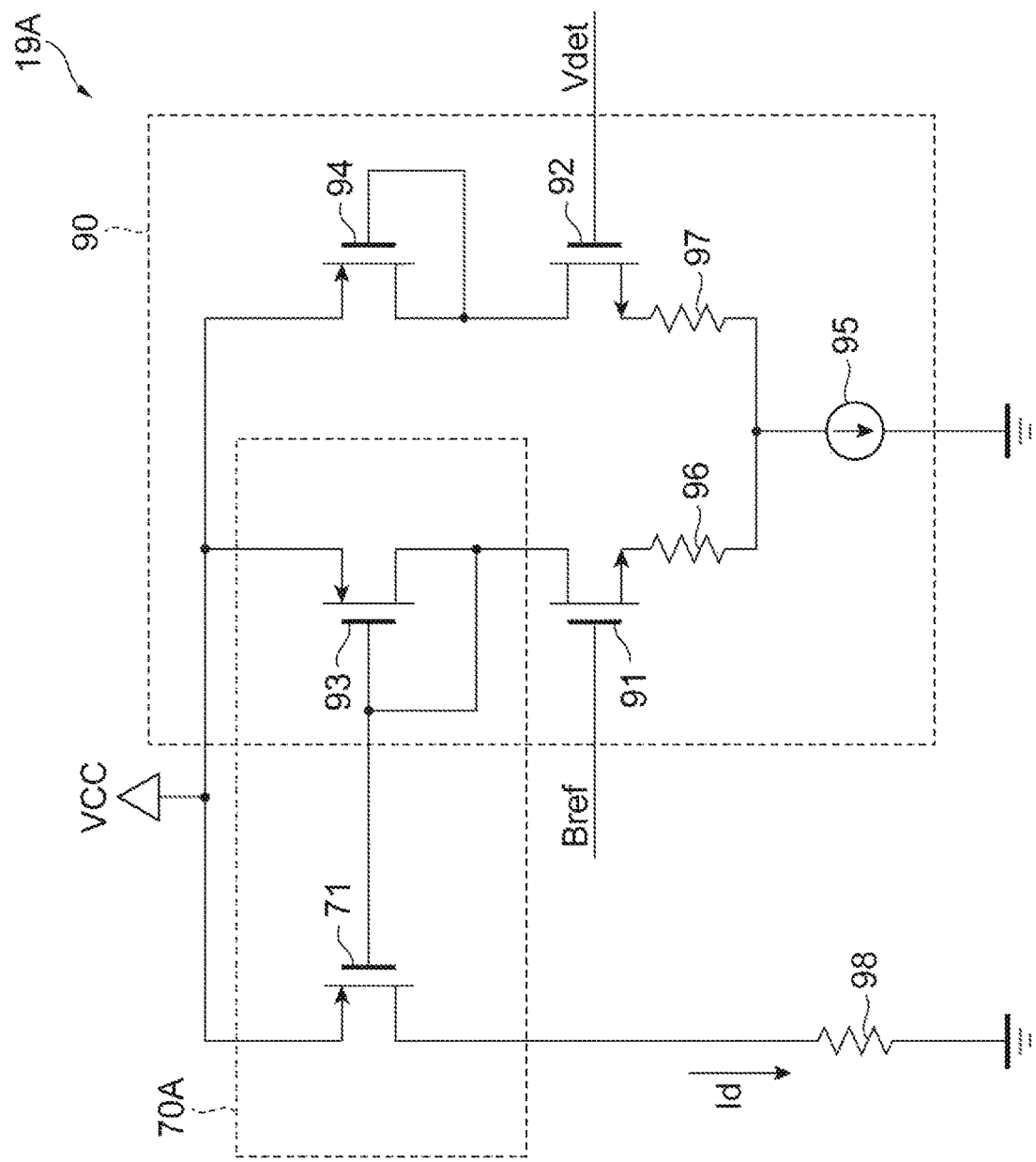
FIG. 9 is a diagram illustrating a circuit structure of a linearity control circuit which is included in the transimpedance amplifier of the second embodiment.

FIG. 8 is a diagram illustrating a circuit structure of a variable gain circuit which is included in a transimpedance amplifier of a second embodiment. FIG. 9 is a diagram illustrating a circuit structure of a linearity control circuit which is included in the transimpedance amplifier of the second embodiment. The transimpedance amplifier of the second embodiment is mainly different from the transimpedance amplifier 10 in that a variable gain circuit 13A and a linearity control circuit 19A are provided instead of the variable gain circuit 13 and the linearity control circuit 19.

As illustrated in FIG. 8, the variable gain circuit 13A is mainly different from the variable gain circuit 13 in that the differential circuit 23A is provided instead of the differential circuit 23. The differential circuit 23A is mainly different from the differential circuit 23 in that a variable resistance circuit 33A is provided instead of the variable resistance circuit 33. The variable resistance circuit 33A is mainly different from the variable resistance circuit 33 in that a common linearity adjustment signal Vctl is supplied instead of the configuration that the linearity adjustment signals Vctl are individually supplied to the gates of the FETs 35_1 to 35_N, and the threshold voltage Vth.

In the variable resistance circuit 33A, the gates of the FETs 35_1 to 35_N are electrically connected to each other. The common linearity adjustment signal Vctl is input to the gates of the FETs 35_1 to 35_N. The threshold voltages Vth_1 to Vth_N are set to values different from each other. In this embodiment, the threshold voltage Vth is increased in an order of the threshold voltage Vth_1, the threshold voltage Vth_2, . . . , and the threshold voltage Vth_N. In other words, the threshold voltage Vth_1 is the smallest, and the threshold voltage Vth_N is the largest.

As illustrated in FIG. 9, the linearity control circuit 19A is mainly different from the linearity control circuit 19 in that the current mirror circuit 70A is provided instead of the current mirror circuit 70, and a resistance element 98 is provided instead of the resistance elements 98_1 and 98_2. The current mirror circuit 70A is mainly different from the current mirror circuit 70 in that the output transistor 71 is provided instead of the output transistors 71_1 and 71_2. In this embodiment, the linearity control circuit 19A generates a single linearity adjustment signal Vctl, and supplies the linearity adjustment signal Vctl to each of the FETs 35_1 to 35_N. The resistance element 98 has a resistance value R.

For example, the output current (drain current) Id proportional to the magnitude of the drain current (input current) of the transistor 93 is output from the output transistor 71. When the output current Id flows to the resistance element 98, a voltage (drain voltage) equal to the resistance value R×the output current Id (current value) is generated in the drain of the output transistor 71 by a voltage drop of the resistance element 98. The linearity control circuit 19A outputs the drain voltage of the output transistor 71 as the linearity adjustment signal Vctl.

As described above, the threshold voltages Vth_1 to Vth_N become large in this order. Therefore, in a case where the resistance value of the variable resistance circuit 33A is set small, the FETs are switched from the OFF state to the ON state in an order of the FET 35_1, the FET 35_2, . . . , and the FET 35_N by gradually increasing the linearity adjustment signal Vctl. On the other hand, in a case where the resistance value of the variable resistance circuit 33A is set large, the FETs are switched from the ON state to the OFF state in an order of the FET 35_N, . . . , the FET 35_2, and the FET 35_1 by gradually decreasing the linearity adjustment signal Vctl. In other words, the timings that the voltage level of the linearity adjustment signal Vctl reaches the threshold voltages Vth_1 to Vth_N are different from each other.

As described above, the transimpedance amplifier of the second embodiment and the variable gain circuit 13A also have the similar effects as those of the transimpedance amplifier 10 and the variable gain circuit 13. In addition, in the transimpedance amplifier and the variable gain circuit 13A of the second embodiment, the threshold voltage Vth becomes large in an order of the threshold voltage Vth_1, the threshold voltage Vth_2, . . . , and the threshold voltage Vth_N. Therefore, the timings that the voltage of the linearity adjustment signal Vctl supplied to the FETs 35_1 to 35_N reaches the threshold voltages Vth_1 to Vth_N can be made different from each other. With this configuration, the linearity adjustment signal Vctl supplied to the gates of the FETs 35_1 to 35_N may be made in common. Therefore, the circuit structure of the linearity control circuit 19A can be simplified still more.

In the variable gain circuit 13A, the gates of two or more FETs 35 among the N FETs 35 may be electrically connected to each other, and may not be electrically connected to the gates of any other FETs 35. In this case, the linearity adjustment signal Vctl supplied to the two or more FETs 35 of which the gates are electrically connected to each other is different from the linearity adjustment signal Vctl supplied to the other FETs 35. The threshold voltages Vth of the two or more FETs 35 of which the gates are electrically connected to each other are set to values different from each other, and the common linearity adjustment signal Vctl is supplied to these FETs 35. Even in this configuration, the number of linearity adjustment signals Vctl can be decreased, so that the circuit structure of the linearity control circuit 19A can be simplified.

Figure 10:
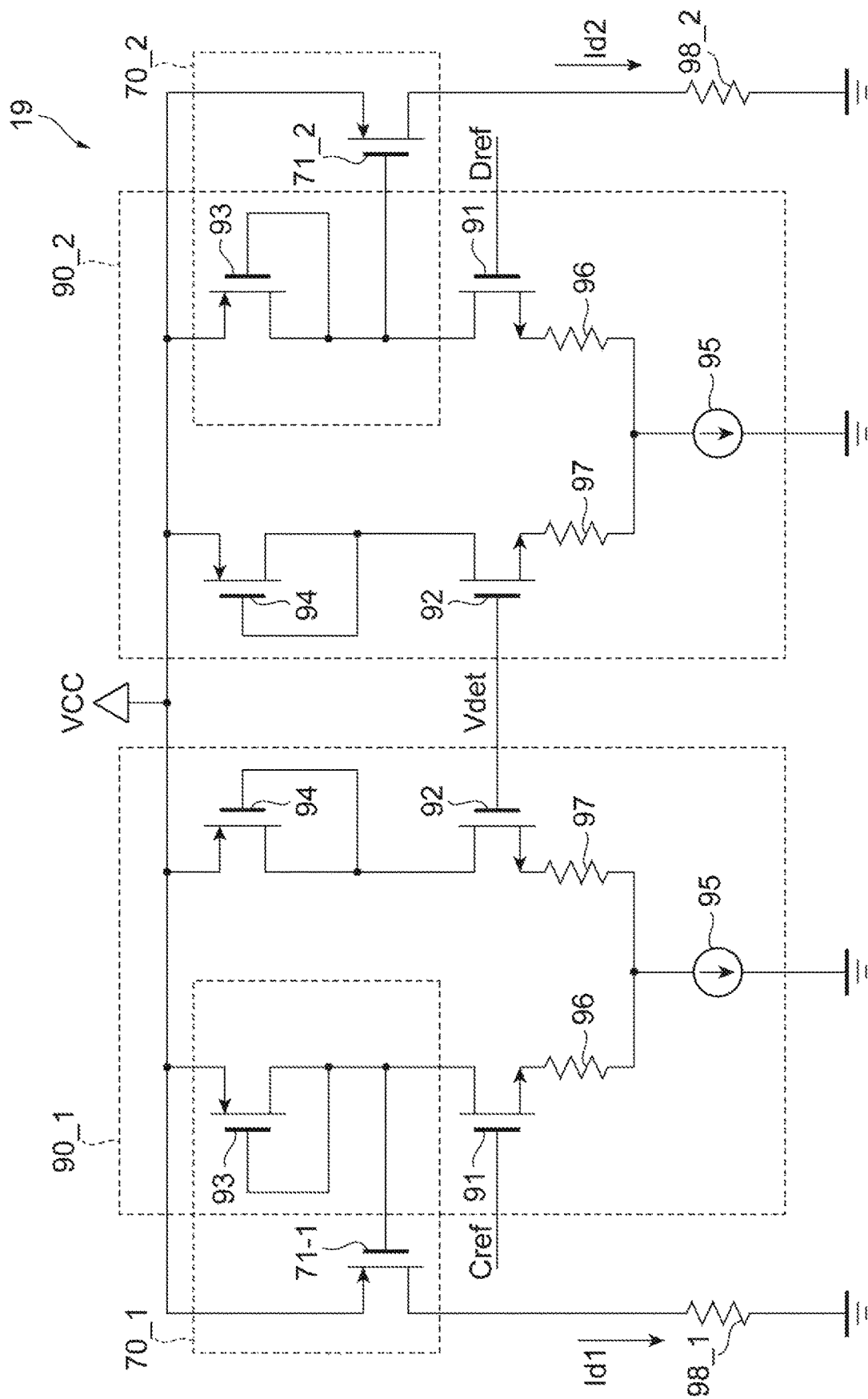
FIG. 10 is a diagram illustrating a modification of a circuit structure of the linearity control circuit illustrated in FIG. 1.

The circuit structure of the linearity control circuit 19 is not limited to the circuit structure illustrated in FIG. 4. For example, as illustrated in FIG. 10, the linearity control circuit 19 may compare the detection signal Vdet with a predetermined first setting value (reference signal Cref) to generate the linearity adjustment signal Vctl_1, and may compare the detection signal Vdet with a predetermined second setting value (reference signal Dref) to generate the linearity adjustment signal Vctl_2. Further, similarly to FIG. 4, the description will be given about the case of N=2 even in FIG. 10 for the sake of simplicity in explanation. The linearity control circuit 19 illustrated in FIG. 10 includes a comparator circuit 90_1, a comparator circuit 90_2, a current mirror circuit 70_1, a current mirror circuit 70_2, the resistance element 98_1, and the resistance element 98_2.

The comparator circuit 90_1, the current mirror circuit 70_1, and the resistance element 98_1 constitute a first linearity control circuit. The first linearity control circuit is mainly different from the linearity control circuit 19A of FIG. 9 in that the reference signal Cref is input to the gate of the transistor 91 instead of the reference signal Bref, the current mirror circuit 70_1 is provided instead of the current mirror circuit 70A, and the resistance element 98_1 is provided instead of the resistance element 98. The current mirror circuit 70_1 is mainly different from the current mirror circuit 70A of FIG. 9 in that the output transistor 71_1 is provided instead of the output transistor 71. The first linearity control circuit compares the detection signal Vdet with the reference signal Cref to generate the linearity adjustment signal Vctl_1.

The comparator circuit 90_2, the current mirror circuit 70_2, and the resistance element 98_2 constitute a second linearity control circuit. The second linearity control circuit is mainly different from the linearity control circuit 19A of FIG. 9 in that the reference signal Dref is input to the gate of the transistor 91 instead of the reference signal Bref, the current mirror circuit 70_2 is provided instead of the current mirror circuit 70A, and the resistance element 98_2 is provided instead of the resistance element 98. The current mirror circuit 70_2 is mainly different from the current mirror circuit 70A of FIG. 9 in that the output transistor 71_2 is provided instead of the output transistor 71. The second linearity control circuit compares the detection signal Vdet with the reference signal Dref to generate the linearity adjustment signal Vctl_2.

While only the reference signal Aref is compared with the detection signal Vdet in the linearity control circuit 19 of FIG. 4, the reference signal Cref and the reference signal Dref different from each other are compared with the detection signal Vdet so as to generate the linearity adjustment signals Vctl_1 and Vctl_2 in the linearity control circuit 19 of FIG. 10. With this configuration, for example, in a case where there is provided a certain voltage difference (400 mV) between the linearity adjustment signals Vctl_1 and Vctl_2 (that is, Vctl_1=Vctl_2+400 mV), the linearity adjustment signals Vctl_1 and Vctl_2 can be easily generated by providing a voltage difference between the voltages of the reference signal Cref and the reference signal Dref. For example, the reference signal Cref and the reference signal Dref are set to satisfy Dref=Cref+400 mV. At this time, the output transistors 71_1 and 71_2 may be provided to be the same structure and the same electrical characteristics, and the resistance values of the resistance elements 98_1 and 98_2 may be set to the same value.

The linearity control circuit 19 may generate the linearity adjustment signals Vctl_1 to Vctl_N on the basis of the amplitudes of the output signals Vout1 and Vout2 (the output signals Voutx1 and Voutx2). Similarly, the linearity control circuit 19A may generate the linearity adjustment signal Vctl on the basis of the amplitudes of the output signals Vout1 and Vout2 (the output signals Voutx1 and Voutx2).

Further, at least two FETs 35 (herein, an FET 35_a and an FET 35_b.) among the N FETs 35 in the variable gain circuits 13 and 13A may be configured to be different from each other such that the timing that the voltage of a linearity adjustment signal Vctl_a (first linearity adjustment signal) input to the FET 35_a (first field effect transistor) reaches the threshold voltage Vth_a (first threshold voltage) of the FET 35_a is different from the timing that the voltage of a linearity adjustment signal Vctl_b (second linearity adjustment signal) input to the FET 35_b (second field effect transistor) reaches the threshold voltage Vth_b (second threshold voltage) of the FET 35_b. In this case, in the variable gain circuit 13, the voltage of the linearity adjustment signal Vctl_a is set larger than the voltage of the linearity adjustment signal Vctl_b. In the variable gain circuit 13A, the threshold voltage Vth_a is set smaller than the threshold voltage Vth_b. In addition, in the variable gain circuits 13 and 13A, the size of the FET 35_a may be smaller than that of the FET 35_b. Further, in the variable gain circuit 13, the threshold voltage Vth_a may be set to a value smaller than the threshold voltage Vth_b, or a value larger than the threshold voltage Vth_b, or the same value as the threshold voltage Vth_b.

Third Embodiment

Figure 11:
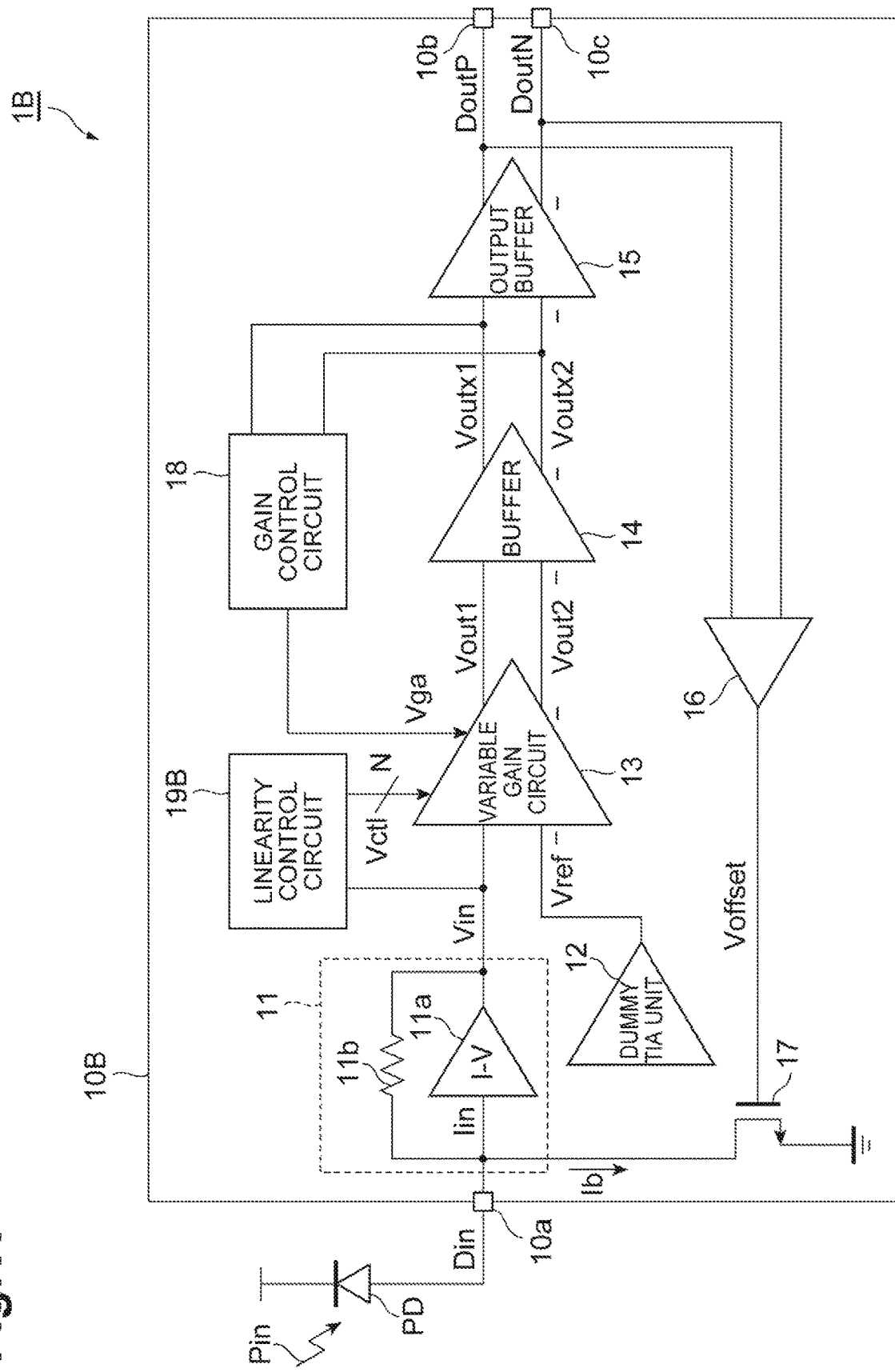
FIG. 11 is a diagram schematically illustrating a configuration of an optical receiver which includes a transimpedance amplifier according to a third embodiment.
Figure 12:
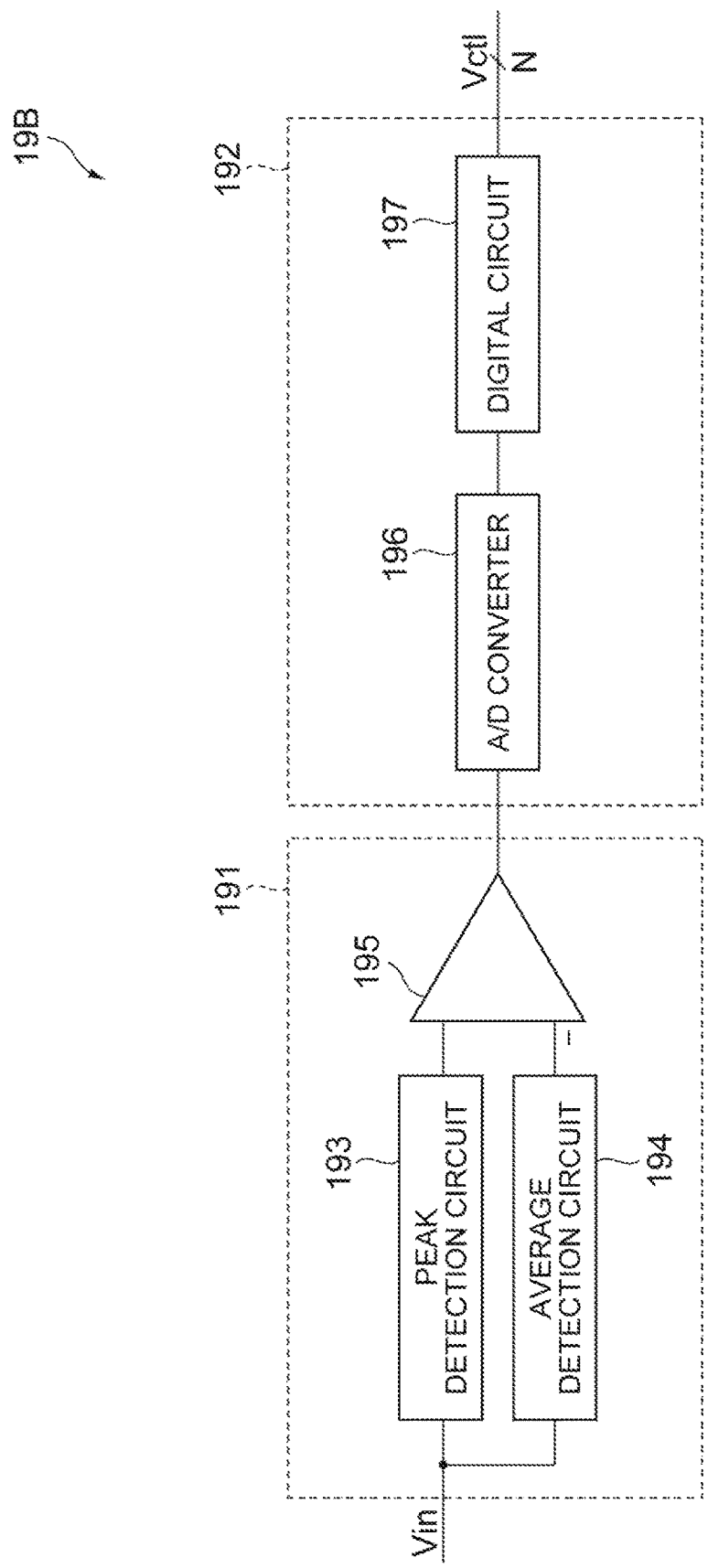
FIG. 12 is a diagram illustrating a circuit structure of the linearity control circuit illustrated in FIG. 11.

FIG. 11 is a diagram schematically illustrating a configuration of an optical receiver which includes a transimpedance amplifier according to a third embodiment. FIG. 12 is a diagram illustrating a circuit structure of the linearity control circuit illustrated in FIG. 11. As illustrated in FIG. 11, an optical receiver 1B is mainly different from the optical receiver 1 in that a transimpedance amplifier 10B is provided instead of the transimpedance amplifier 10. The transimpedance amplifier 10B is mainly different from the transimpedance amplifier 10 in that a linearity control circuit 19B is provided instead of the linearity control circuit 19.

The linearity control circuit 19B is a circuit which generates the linearity adjustment signal Vctl on the basis of the amplitude of the voltage signal Vin. Specifically, the linearity control circuit 19B switches the ON state and the OFF state of each of the FETs 35_1 to 35_N by the linearity adjustment signal Vctl such that the resistance value of the variable resistance circuit 33 becomes larger as the amplitude of the voltage signal Vin is larger. The resistance value of the variable resistance circuit 33 becomes larger as the number of FETs in the OFF state is increased and the number of FETs in the ON state is decreased among the N FETs 35_1 to 35_N. Therefore, the linearity control circuit 19B generates the linearity adjustment signal Vctl, for example, such that the number of FETs in the ON state is decreased and the number of FETs in the OFF state is increased as the amplitude of the voltage signal Vin is large.

The voltage level of the linearity adjustment signal Vctl_k is set to any one of "0" level and "1" level, but not set to be close the threshold voltage of the FET 35_k. "0" level is sufficiently smaller than the threshold voltage of the FET 35_k. "1" level is sufficiently larger than the threshold voltage of the FET 35_k. Therefore, in a case where the linearity adjustment signal Vctl_k of "0" level is input, the state of the FET 35_k becomes the OFF state. In a case where the linearity adjustment signal Vctl_k of "1" level is input, the state of the FET 35_k becomes the ON state. Therefore, the individual FET 35_k serves as an electric switch which is controlled by each linearity adjustment signal Vctl_k. Further, in this embodiment, the sizes (the gate width W and the gate length L) of the FETs 35_1 to 35_N are equal to each other, and the ON resistance values of the FETs 35_1 to 35_N are equal to each other. The threshold voltages Vth_1 to Vth_N may be equal to each other, or may be different from each other.

In this way, each of the FETs 35_1 to 35_N is individually set to the ON state or the OFF state, so that the FETs 35_1 to 35_N serve as a variable resistor. In this way, the resistance value of the variable resistance circuit 33 can be uniformly changed in a certain interval by changing the number of FETs of the ON state and the number of FETs of the OFF state among the plurality of FETs 35_1 to 35_N having the same resistance value between drain and source. In addition, the state of the individual FET 35_k is any one of the ON state and the OFF state. Therefore, the influence of a transitional voltage in the differential circuit 23 as described below can be avoided, and the degradation in linearity can be suppressed.

As illustrated in FIG. 12, the linearity control circuit 19B includes an amplitude detection circuit 191 (second amplitude detection circuit) and a generation circuit 192 (second generation circuit). The amplitude detection circuit 191 is a circuit to detect the amplitude of the voltage signal Vin. The amplitude detection circuit 191 includes a peak detection circuit 193, an average detection circuit 194, and a differential amplifier 195.

The peak detection circuit 193 is a circuit to detect the peak value of the voltage signal Vin. The peak detection circuit 193 outputs the detected peak value to the differential amplifier 195. The average detection circuit 194 is a circuit to detect the temporal average value (average voltage values) of the voltage signal Vin. The average detection circuit 194 outputs the detected average value to the differential amplifier 195. The differential amplifier 195 generates a difference value between the peak value detected by the peak detection circuit 193 and the average value detected by the average detection circuit 194, and detects the amplitude of the voltage signal Vin on the basis of the difference value. The peak value is input to a non-inverting input terminal of the differential amplifier 195, and the average value is input to an inverting input terminal of the differential amplifier 195. The differential amplifier 195 detects the amplitude from a value (equal to ½ of the amplitude) obtained by subtracting the average value from the peak value. The differential amplifier 195 outputs the detected amplitude to the generation circuit 192.

The generation circuit 192 is a circuit to generate the linearity adjustment signal Vctl on the basis of the amplitude of the voltage signal Vin. The generation circuit 192 includes an A/D converter 196 and a digital circuit 197. The A/D converter 196 is a circuit to convert the amplitude of the voltage signal Vin detected by the amplitude detection circuit 191 into a digital value. The A/D converter 196 outputs the digital value to the digital circuit 197. The digital circuit 197 generates the linearity adjustment signal Vctl such that the resistance value of the variable resistance circuit 33 becomes larger as a digital value is larger. In other words, the number of FETs in the OFF state is increased and the number of FETs in the ON state is decreased among the N FETs 35_1 to 35_N by adjusting the linearity adjustment signal Vctl.

For example, in the digital circuit 197, N thresholds (the first threshold, a second threshold, . . . , and an N-th threshold) are set in advance in a descending order of value. In other words, the thresholds are set to satisfy the first threshold>the second threshold> . . . >an (N−1)th threshold>the N-th threshold. In a case where the digital value received from the A/D converter 196 is larger than the first threshold, the digital circuit 197 generates the linearity adjustment signal Vctl to set all the FETs 35_1 to 35_N to be the OFF state. Specifically, the digital circuit 197 generates the linearity adjustment signals Vctl_1 to Vctl_N of "0" level. In other words, the digital circuit 197 sets all the linearity adjustment signals Vctl_1 to Vctl_N to "0" level. In a case where the digital value is equal to or less than the first threshold and larger than the second threshold, the digital circuit 197 generates the linearity adjustment signal Vctl to set one of the FETs 35_1 to 35_N to be the ON state, and the other N−1 FETs to be the OFF state. For example, the digital circuit 197 generates the linearity adjustment signal Vctl_1 of "1" level and the linearity adjustment signals Vctl_2 to Vctl_N of "0" level.

Similarly, in a case where the digital value is equal to or less than a k-th threshold, and larger than a (k+1)th threshold, the digital circuit 197 generates the linearity adjustment signal Vctl to set k FETs among the FETs 35_1 to 35_N to be the ON state and (N−k) FETs to be the OFF state. For example, the digital circuit 197 generates the linearity adjustment signals Vctl_1 to Vctl_k of "1" level and the linearity adjustment signals Vctl_k+1 to Vctl_N of "0" level. In a case where the digital value is equal to or less than the N-th threshold, the digital circuit 197 generates the linearity adjustment signal Vctl to set all the FETs 35_1 to 35_N to be the ON state. Specifically, the digital circuit 197 generates the linearity adjustment signals Vctl_1 to Vctl_N of "1" level. In other words, the digital circuit 197 sets all the linearity adjustment signals Vctl_1 to Vctl_N to be "1" level.

In other words, the linearity control circuit 19B increases the number of FETs of the OFF state and decreases the number of FETs of the ON state among the FETs 35_1 to 35_N by the linearity adjustment signal Vctl as the amplitude of the voltage signal Vin is larger. In addition, the linearity control circuit 19B decreases the number of FETs of the OFF state and increases the number of FETs of the ON state among the FETs 35_1 to 35_N by the linearity adjustment signal Vctl as the amplitude of the voltage signal Vin is decreased. With this configuration, the resistance value between the emitter of the transistor 31 and the emitter of the transistor 32 is controlled to be variable.

In the transimpedance amplifier 10B, it is hard to obtain a sufficient gain only by the TIA unit 11 as the frequency of the input current signal Din is increased. The noises of the variable gain circuit 13 is necessarily reduced in order to suppress an input conversion noise of the transimpedance amplifier 10B. Therefore, since the gain of the variable gain circuit 13 is increased by decreasing the resistance value of the variable resistance circuit 33, it is decreased an influence degree of the inner shot noises of the variable gain circuit 13, the thermal noises of the load elements 27 and 28 and the like onto the input conversion noise of the transimpedance amplifier 10B. In other words, the influence degree of the inner noise components of the variable gain circuit 13 onto the input conversion noise of the transimpedance amplifier 10B becomes a value obtained by dividing the noises of these noise sources by the gain from the input of the transimpedance amplifier 10B to the output of the variable gain circuit 13. Therefore, the noises (input conversion noise) are reduced by increasing the gain of the variable gain circuit 13.

Therefore, the variable gain circuit 13 is controlled such that the resistance value of the variable resistance circuit 33 is set small to reduce the noises when the amplitude of the voltage signal Vin is small, and the resistance value of the variable resistance circuit 33 is set large to expand a linear input range when the amplitude of the voltage signal Vin is large.

Figure 13A:
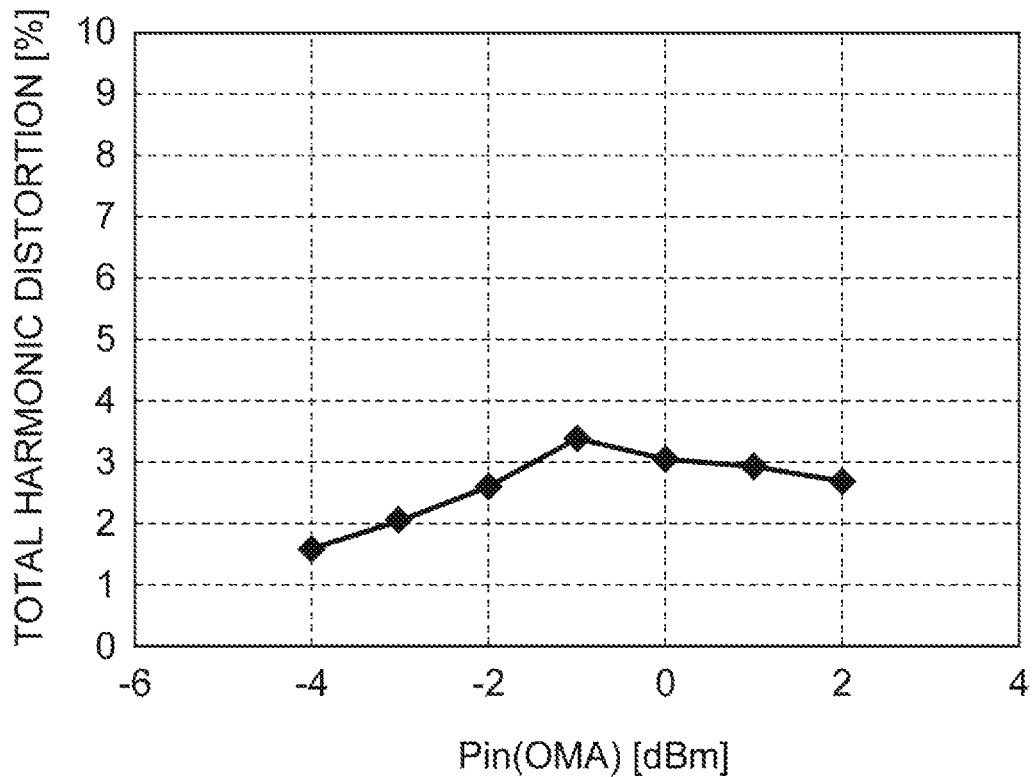
FIG. 13A is a diagram illustrating a simulation result of a total harmonic distortion of the output waveform with respect to an input optical power of the transimpedance amplifier illustrated in FIG. 11.
Figure 13B:
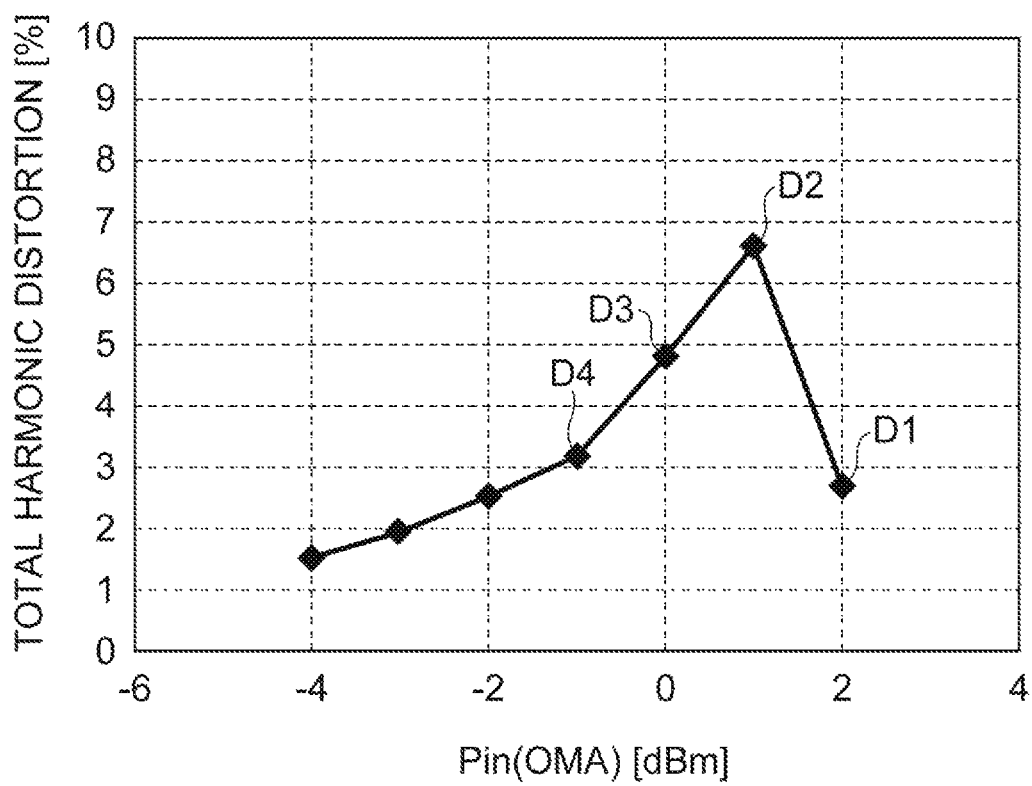
FIG. 13B is a diagram illustrating a simulation result of a total harmonic distortion of the output waveform with respect to an input optical power of the transimpedance amplifier of the comparative example.

Next, the operational effect of the transimpedance 10B and the variable gain circuit 13 with reference to FIGS. 5, 6, 13A, and 13B, while compared with the transimpedance amplifier of the comparative example. FIG. 13A is a diagram illustrating a simulation result of a total harmonic distortion of the output waveform with respect to an input optical power of the transimpedance amplifier illustrated in FIG. 11. FIG. 13B is a diagram illustrating a simulation result of a total harmonic distortion of the output waveform with respect to an input optical power of the transimpedance amplifier of the comparative example.

The horizontal axis of FIGS. 13A and FIG. 13B represents an optical modulation amplitude (OMA) [dBm] of the optical signal Pin, and the vertical axis of FIGS. 13A and 13B represents the total harmonic distortion (THD) [%] of the output waveform. Herein, there is illustrated a total harmonic distortion of the output signals Vout1 and Vout2 which are output from the variable gain circuits 13 and 113 in a case where a sinusoidal wave of 1 GHz is used as the voltage signal Vin. Further, in a case where there is used a sinusoidal wave having a frequency of 1 GHz as the voltage signal Vin, only the frequency component of 1 GHz is left in frequency spectrums of the output signals Vout1 and Vout2 output from the variable gain circuits 13 and 113 in an ideal state where there is no distortion. When the distortion becomes large, the frequency component (harmonics) having an integer multiple of 1 GHz is increased.

Characteristic values D1 to D4 illustrated in FIG. 13B are characteristic values on the bias conditions of Graphs G1 to G4 illustrated in FIG. 6, respectively. As described above, the voltage level of the linearity adjustment signal Vctl becomes large in an order of Graphs G1 to G4, and the gain (absolute value) becomes large. Specifically, on the bias condition of Graph G1, the voltage level of the linearity adjustment signal Vctl is sufficiently smaller than the threshold voltage of the FET 35, and the FET 35 of the variable resistance circuit 133 is in the OFF state. On the bias conditions of Graphs G2 and G3, the voltage level of the linearity adjustment signal Vctl is near the threshold voltage of the FET 35. At this time, the resistance value of the FET 35 is lowered, and the gain of the variable gain circuit 113 becomes large. However, the slopes of Graphs G2 and G3 are large when the differential input voltage is "0". In other words, the gains in Graphs G2 and G3 are asymmetrical in the positive and negative differential input voltages. Therefore, the positive amplitude and the negative amplitude of the output signals Vout1 and Vout2 are different. Therefore, as illustrated in FIG. 13B, the linearity of the transimpedance amplifier of the comparative example is degraded in a case where the OMA of the optical signal Pin is in 0 to +1 dBm.

In the bias condition of Graph G4, the voltage level of the linearity adjustment signal Vctl is sufficiently larger than the threshold voltage of the FET 35. Therefore, terminal voltages (the source voltage and the drain voltage) of the FET 35 has less influence on the resistance value of the FET 35, and the asymmetry is improved.

On the other hand, in the transimpedance amplifier 10B, voltages close the threshold voltages of the FETs 35_1 to 35_N are not used as the voltage levels of the linearity adjustment signals Vctl_1 to Vctl_N in order to switch the resistance value of the variable resistance circuit 33. Therefore, in a case where the voltage levels of the linearity adjustment signals Vctl_1 to Vctl_N are "0" level, the voltage levels of the linearity adjustment signals Vctl_1 to Vctl_N are always smaller than the emitter voltage of the transistor 31 and the emitter voltage of the transistor 32 regardless of the amplitude of the voltage signal Vin. On the other hand, in a case where the voltage levels of the linearity adjustment signals Vctl_1 to Vctl_N are "1" level, the voltage levels of the linearity adjustment signals Vctl_1 to Vctl_N are always larger than the emitter voltage of the transistor 31 and the emitter voltage of the transistor 32 regardless of the amplitude of the voltage signal Vin. With this configuration, the influence of the terminal voltages (the source voltage and the drain voltage) of the FETs 35_1 to 35_N onto the resistance values of the FETs 35_1 to 35_N becomes less. As a result, as illustrated in FIG. 13A, the peak of the total harmonic distortion is decreased from about 7% to about 3%, and the degradation in linearity is suppressed.

As described above, in the transimpedance amplifier 10B and the variable gain circuit 13, the voltage signal Vin is input to the base of the transistor 31 included in the differential circuit 23, and the reference signal Vref is supplied to the base of the transistor 32. In such an asymmetrical configuration, if the FET 35 is particularly in a transition state like the transimpedance amplifier of the comparative example, the variation of the terminal voltages of the source and the drain affects the resistance value between the source and drain. There is a concern that the linearity of the output signals Vout1 and Vout2 with respect to the voltage signal Vin is degraded. With this regard, in the transimpedance amplifier 10B and the variable gain circuit 13, the linearity adjustment signals Vctl_1 to Vctl_N are supplied to the gates of the FETs 35_1 to 35_N respectively, so that each of the FETs 35_1 to 35_N is switched to any one of the ON state and the OFF state. With this configuration, the resistance value of the variable resistance circuit 33 is set. Therefore, the resistance value of the variable resistance circuit 33 can be changed by stages without setting each of the FETs 35_1 to 35_N to be a transition state, so that the resistance value of the variable resistance circuit 33 can be stabilized. As a result, it is possible to improve the linearity of the output signals Vout1 and Vout2 with respect to the voltage signal Vin.

The gain control circuit 18 generates the gain adjustment signal Vga on the basis of the amplitudes of the output signals Voutx1 and Voutx2. Therefore, the gain adjustment signal Vga is generated using the output signals Voutx1 and Voutx2. With this configuration, for example, the gain of the variable gain circuit 13 can be adjusted such that the linearity of the amplification in the variable gain circuit 13 can be maintained. As a result, it is possible to expand the voltage range of the voltage signal Vin.

The linearity control circuit 19B generates the linearity adjustment signal Vctl on the basis of the amplitude of the voltage signal Vin. Therefore, the control of the variable resistance circuit 33 is performed using the voltage signal Vin. In other words, the linearity of the variable gain circuit 13 is controlled using the voltage signal Vin before being amplified by the variable gain circuit 13. Therefore, there is no influence of the variation of the amplification caused by the variable gain circuit 13, and the linearity of the variable gain circuit 13 can be controlled.

Fourth Embodiment

Figure 14:
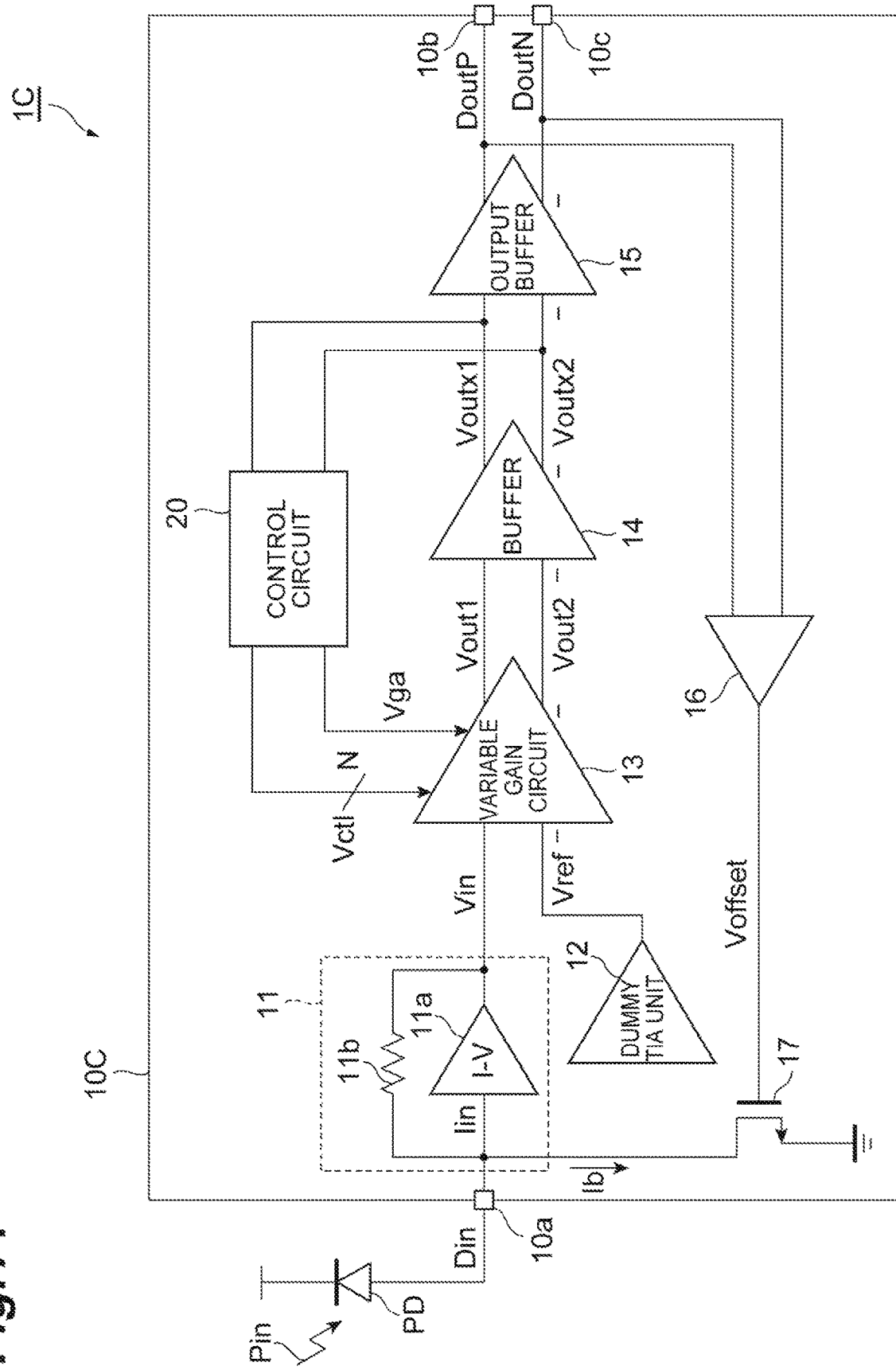
FIG. 14 is a diagram schematically illustrating a configuration of an optical receiver which includes a transimpedance amplifier according to a fourth embodiment.
Figure 15:
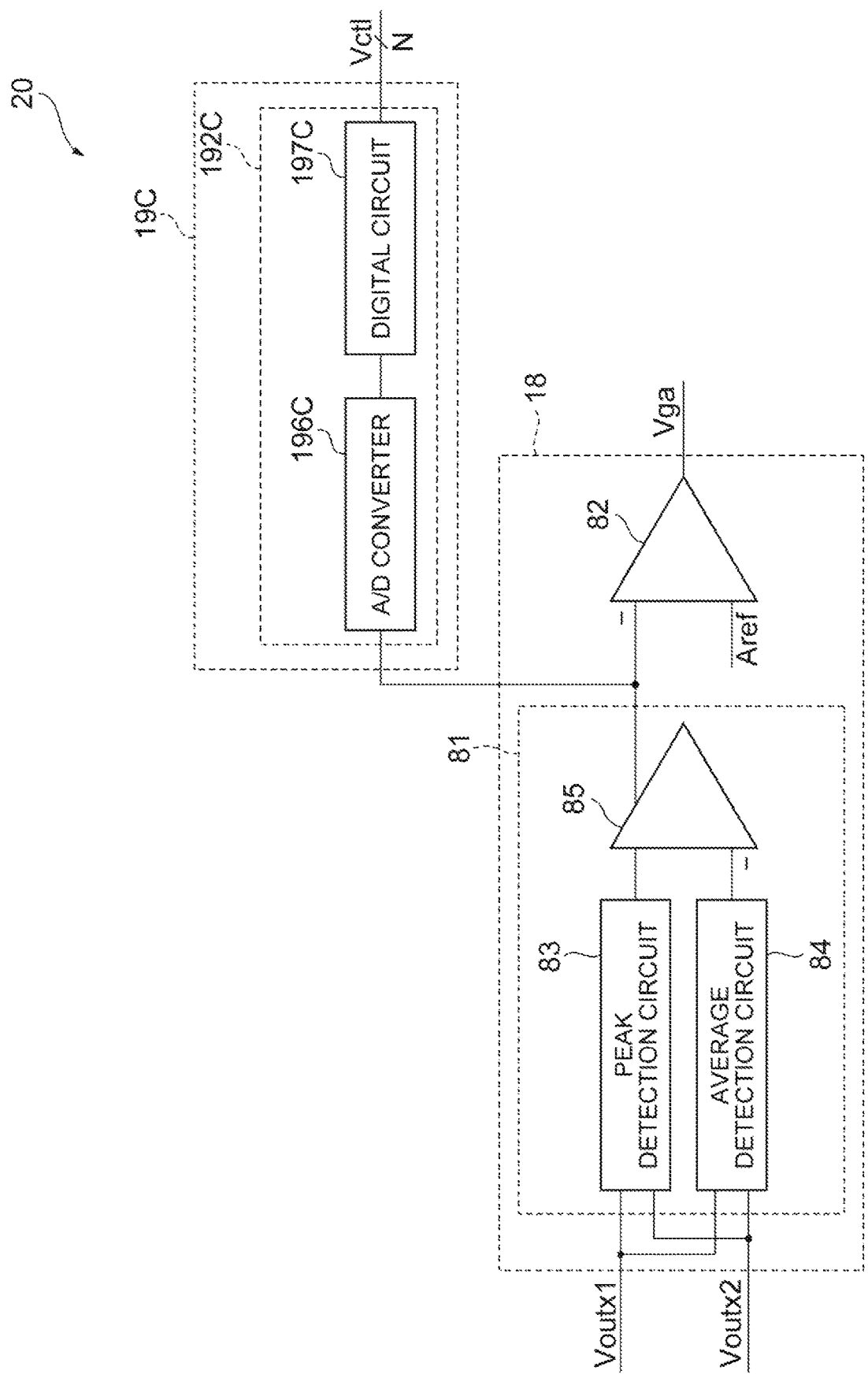
FIG. 15 is a diagram illustrating a circuit structure of a control circuit illustrated in FIG. 14.

Next, a transimpedance amplifier according to a fourth embodiment will be described with reference to FIGS. 14 and 15. FIG. 14 is a diagram schematically illustrating a configuration of an optical receiver which includes the transimpedance amplifier according to the fourth embodiment. FIG. 15 is a diagram illustrating a circuit structure of a control circuit illustrated in FIG. 14. As illustrated in FIG. 14, an optical receiver 1C is mainly different from the optical receiver 1B in that a transimpedance amplifier 10C is provided instead of the transimpedance amplifier 10B. The transimpedance amplifier 10C is mainly different from the transimpedance amplifier 10B in that a control circuit 20 is provided instead of the gain control circuit 18 and the linearity control circuit 19B.

The control circuit 20 is a circuit which generates the gain adjustment signal Vga and the linearity adjustment signal Vctl on the basis of the amplitudes of the output signals Vout1 and Vout2 (the output signals Voutx1 and Voutx2). The control circuit 20 includes the gain control circuit 18 and a linearity control circuit 19C. The linearity control circuit 19C is mainly different from the linearity control circuit 19B in that the amplitude detection circuit 191 is not provided and a generation circuit 192C (second generation circuit) is provided instead of the generation circuit 192.

The generation circuit 192C is a circuit that generates the linearity adjustment signal Vctl on the basis of the amplitude detected by the amplitude detection circuit 81. The generation circuit 192C includes an A/D converter 196C and a digital circuit 197C. The A/D converter 196C is a circuit that converts the amplitudes of the output signals Voutx1 and Voutx2 detected by the amplitude detection circuit 81 into a digital value. The A/D converter 196C outputs the digital value to the digital circuit 197C. The digital circuit 197C generates the linearity adjustment signal Vctl such that the resistance value of the variable resistance circuit 33 becomes larger as the digital value converted by the A/D converter 196C is larger. The digital circuit 197C is different from the digital circuit 197 in the setting values of the first threshold, the second threshold, . . . , and the N-th threshold. The values of the thresholds are set in accordance with the amplitudes of the output signals Voutx1 and Voutx2.

In other words, the linearity control circuit 19C switches the ON state and the OFF state of each of the FETs 35_1 to 35_N by the linearity adjustment signal Vctl such that the resistance value of the variable resistance circuit 33 becomes larger as the amplitudes of the output signals Vout1 and Vout2 (the output signals Voutx1 and Voutx2) are larger. Specifically, the linearity control circuit 19C increases the number of FETs of the OFF state and decreases the number of FETs of the ON state among the FETs 35_1 to 35_N by the linearity adjustment signal Vctl as the amplitudes of the output signals Vout1 and Vout2 (the output signals Voutx1 and Voutx2) are larger. In addition, the linearity control circuit 19C decreases the number of FETs of the OFF state and increases the number of FETs of the ON state among the FETs 35_1 to 35_N by the linearity adjustment signal Vctl as the amplitudes of the output signals Vout1 and Vout2 (the output signals Voutx1 and Voutx2) are smaller. With this configuration, the resistance value between the emitter of the transistor 31 and the emitter of the transistor 32 is controlled to be variable.

Even in the transimpedance amplifier 10C described above, the similar effect to the transimpedance amplifier 10B is achieved.

In the transimpedance amplifier 10C, the linearity control circuit 19C generates the linearity adjustment signal Vctl on the basis of the amplitudes of the output signals Vout1 and Vout2 (the output signals Voutx1 and Voutx2). Therefore, the control of the variable resistance circuit 33 is performed using the amplitudes of the output signals Vout1 and Vout2 (the output signals Voutx1 and Voutx2). In other words, the gain and the linearity of the variable gain circuit 13 both are controlled with the amplitude detected by the amplitude detection circuit 81. Therefore, the amplitude detection circuit 81 can be made in common in the gain control and the linearity control of the variable gain circuit 13. With this configuration, a circuit scale of the transimpedance amplifier 10C can be made small.

Further, the transimpedance amplifier and the variable gain circuit according to the present disclosure are not limited to the above embodiments.

For example, in the above embodiments, the transistors 31, 32, 51, 52, 61, and 62 have been described using the bipolar transistors, but the transistors 31, 32, 51, 52, 61, and 62 may be the FETs. In a case where the transistors 31, 32, 51, 52, 61, and 62 are the FETs, "base", "emitter", and "collector" of a bipolar transistor may be rewritten with "gate", "source", and "drain".

The sizes (the gate width W and the gate length L) of the N FETs 35 may be different from each other, or may be equal to each other. In addition, the sizes of some of the N FETs 35 may be equal to each other.

For example, in a case where the sizes of the FETs 35_1 to 35_N are different from each other, the resistance values of the FETs 35_1 to 35_N are different from each other. The resistance values of the FETs 35_1 to 35_N become larger as a value W/L obtained by dividing the gate width W by the gate length L is smaller. In this case, in the third embodiment and the fourth embodiment, a combination of the FETs to be set in the ON state and the FETs to be set in the OFF state among the FETs 35_1 to 35_N may be determined in advance in accordance with the digital values output from the A/D converters 196 and 196C. The digital circuits 197 and 197C generate the linearity adjustment signals Vctl to set the FETs to the ON state or the OFF state in accordance with the combination in the FETs 35_1 to 35_N. The number of FETs 35 can be reduced by appropriately setting the sizes of the FETs 35_1 to 35_N. With this configuration, the circuit scale of the variable gain circuit 13 can be made small.

For example, it is assumed that N=11 and there is needed four patterns in the variable gain circuit 13 of FIG. 2. The four patterns include a pattern for setting all the FETs 35_1 to 35_11 to the ON state, a pattern for setting only one FET 35 to the ON state, a pattern for setting three FETs 35 to the ON state, and a pattern for setting all the FETs 35_1 to 35_11 to the OFF state. With this regard, the four patterns can be realized by using three FETs 35 of which the size ratio is 1:2:8.

The gain and the linearity of the variable gain circuit 13 can be adjusted by the variable resistance circuit 33 (the differential circuit 23). Therefore, the variable gain circuit 13 may not include the differential amplifier 24, the differential circuit 25, and the differential circuit 26. In the variable gain circuit 13 illustrated in FIG. 16, the collector of the transistor 31 is electrically connected to the supply voltage VCC through the load element 27. The collector of the transistor 32 is electrically connected to the supply voltage VCC through the load element 28. The load element 27 converts the current signal Ic1 into the output signal Vout1 (one of the pair of complementary signals). Specifically, the collector potential of the transistor 31 which is generated by the current signal Ic1 flowing to the load element 27 is output as the output signal Vout1. The load element 28 converts the current signal Ic2 into the output signal Vout2 (the other one of the pair of complementary signals). Specifically, the collector potential of the transistor 32 which is generated by the current signal Ic2 flowing to the load element 28 is output as the output signal Vout2. In this case, the transimpedance amplifier according to the respective embodiments may not include the gain control circuit 18.

Figure 16:
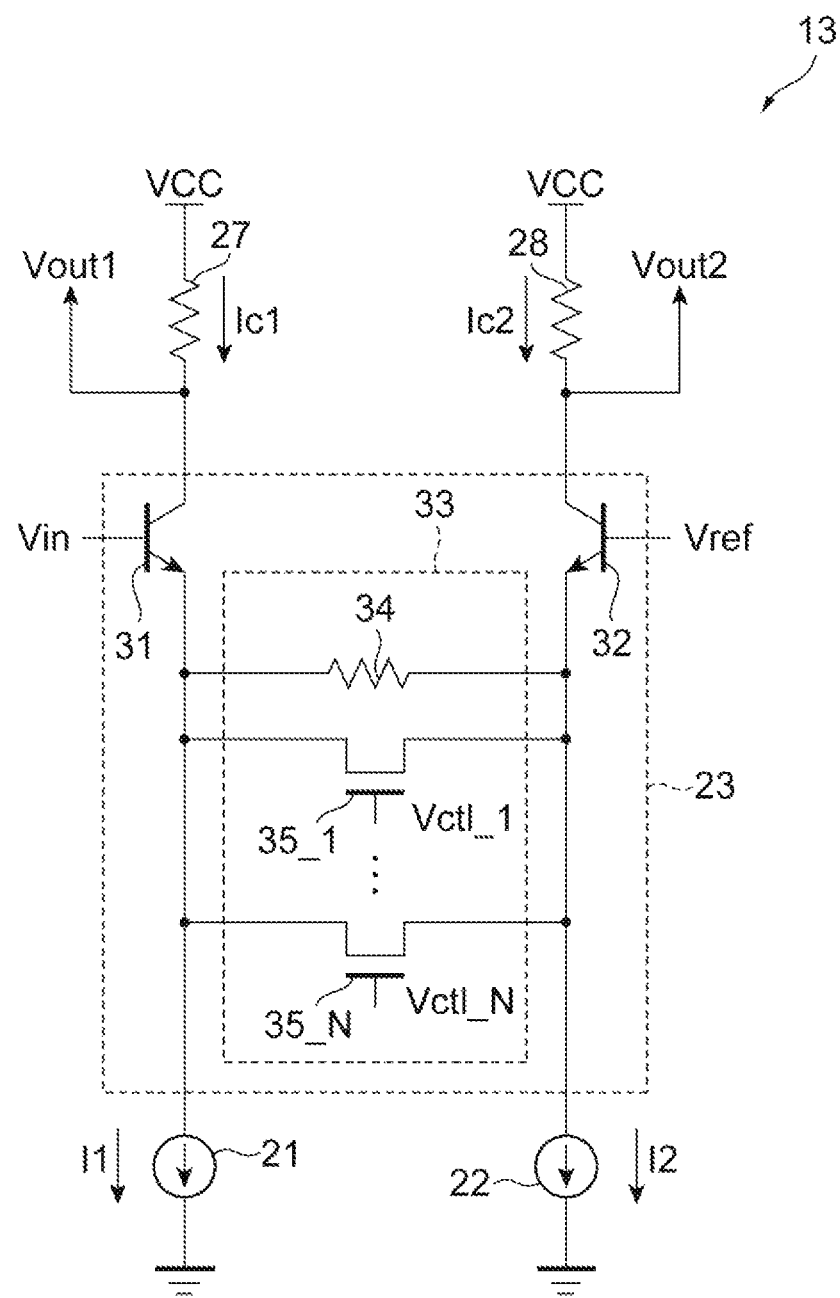
FIG. 16 is a diagram illustrating a circuit structure of a modification of the variable gain circuit illustrated in FIG. 2.

Further, the variable gain circuit 13 illustrated in FIG. 16 outputs a signal obtained by inversely amplifying a difference signal (Vin−Vref) between the voltage signal Vin and the reference signal Vref as a difference signal (differential output signal) between the output signal Vout1 and the output signal Vout2. For example, by reversing the output signal Vout1 and the output signal Vout2, the variable gain circuit 13 can output the signal obtained by non-inversely amplifying the difference signal (Vin−Vref) as the difference signal (differential output signal) between the output signal Vout1 and the output signal Vout2. In the variable gain circuit 13, the linearity adjustment signals Vctl_1 to Vctl_N supplied to the variable resistance circuit 33 are set depending not only on the amplitude of the voltage signal Vin but also even depending on the amplitudes of the output signals Voutx1 and Voutx2.

Similarly, the variable gain circuit 13A may not include the differential amplifier 24, the differential circuit 25, and the differential circuit 26.

What is claimed is:

1. A transimpedance amplifier, comprising:
a variable gain circuit configured to generate a pair of complementary signals in accordance with an input signal and a reference signal, the complementary signals including a first complementary signal and a second complementary signal; and
a linearity control circuit configured to generate a plurality of linearity adjustment signals to secure linearity of the variable gain circuit,
wherein the variable gain circuit includes
a first current source configured to supply a first current,
a second current source configured to supply a second current,
a first differential circuit configured to divide each of the first current and the second current into two parts in accordance with the input signal and the reference signal to generate a first current signal and a second current signal,
a first load element configured to generate the first complementary signal based at least in part on the first current signal, and
a second load element configured to generate the second complementary signal based at least in part on the second current signal,
wherein the first differential circuit includes
a first transistor including a control terminal to receive the input signal, a first current terminal to be electrically connected to the first current source, and a second current terminal to output the first current signal,
a second transistor including a control terminal to receive the reference signal, a first current terminal to be electrically connected to the second current source, and a second current terminal to output the second current signal, and
a variable resistance circuit including a plurality of field effect transistors, each of the field effect transistors being configured with a gate such that the linearity adjustment signals are input to the gates one-to-one, a source that is commonly connected to the first current terminal of the first transistor, and a drain that is commonly connected to the first current terminal of the second transistor,
wherein the variable resistance circuit has a combined resistance value which is obtained by combining respective resistance values of the field effect transistors,
wherein the linearity control circuit supplies the plurality of the linearity adjustment signals to the plurality of field effect transistors such that the combined resistance value becomes larger as an amplitude of the input signal or an amplitude of the pair of complementary signals is larger,
wherein each field effect transistor has a threshold voltage which is a voltage of the linearity adjustment signals for switching from an OFF state for electrically disconnecting the drain and the source thereof to an ON state for electrically connecting the drain and the source thereof,
wherein the plurality of field effect transistors includes a first field effect transistor and a second field effect transistor, and
wherein the plurality of the linearity adjustment signals includes a first linearity adjustment signal input to the first field effect transistor and a second linearity adjustment signal input to the second field effect transistor, the first linearity adjustment signal having a first timing when a voltage of the first linearity adjustment signal reaches a first threshold voltage of the first field effect transistor, the second linearity adjustment signal having a second timing when a voltage of the second linearity adjustment signal reaches a second threshold voltage of the second field effect transistor, the first timing and the second timing being different from each other.

2. The transimpedance amplifier according to claim 1, wherein the voltage of the first linearity adjustment signal is larger than the voltage of the second linearity adjustment signal.

3. The transimpedance amplifier according to claim 1, wherein the first threshold voltage is smaller than the second threshold voltage.

4. The transimpedance amplifier according to claim 1, wherein a resistance value in an ON state of the first field effect transistor is larger than a resistance value in an ON state of the second field effect transistor.

5. The transimpedance amplifier according to claim 1, further comprising:
a gain control circuit configured to generate a gain adjustment signal in order to adjust a gain of the variable gain circuit,
wherein the variable gain circuit further includes
a second differential circuit configured to divide the first current signal into a third current signal and a fourth current signal in accordance with the gain adjustment signal, and
a third differential circuit configured to divide the second current signal into a fifth current signal and a sixth current signal in accordance with the gain adjustment signal,
wherein the second current terminal of the first transistor is electrically connected to the second differential circuit,
wherein the second current terminal of the second transistor is electrically connected to the third differential circuit,
wherein the first load element converts the fourth current signal into the first complementary signal, and
wherein the second load element converts the sixth current signal into the second complementary signal.

6. The transimpedance amplifier according to claim 5, wherein the gain control circuit includes an amplitude detection circuit configured to detect amplitude of the pair of complementary signals and a generation circuit configured to generate the gain adjustment signal based at least in part on the amplitude.

7. A variable gain circuit for generating a pair of complementary signals including a first complementary signal and a second complementary signal in accordance with an input signal and a reference signal, comprising:
a first current source configured to supply a first current;
a second current source configured to supply a second current;
a first differential circuit configured to divide each of the first current and the second current into two parts in accordance with the input signal and the reference signal to generate a first current signal and a second current signal;

a first load element configured to generate the first complementary signal based at least in part on the first current signal; and a second load element configured to generate the second complementary signal based at least in part on the second current signal, wherein the first differential circuit includes a first transistor including a control terminal to receive the input signal, a first current terminal to be electrically connected to the first current source, and a second current terminal to output the first current signal, a second transistor including a control terminal to receive the reference signal, a first current terminal to be electrically connected to the second current source, and a second current terminal to output the second current signal, and a variable resistance circuit including a plurality of field effect transistors, each of the field effect transistors being configured such that a source is commonly connected to the first current terminal of the first transistor, and a drain is commonly connected to the first current terminal of the second transistor, wherein the variable resistance circuit has a combined resistance value which is obtained by combining resistance values of the plurality of field effect transistors, wherein each field effect transistor receives one of a plurality of linearity adjustment signals at a gate thereof, one-to-one, wherein each field effect transistor has a threshold voltage which is a voltage of the linearity adjustment signals for switching from an OFF state for electrically disconnecting the drain and the source thereof to an ON state for electrically connecting the drain and the source thereof, wherein the plurality of the field effect transistors includes a first field effect transistor and a second field effect transistor, and wherein the linearity adjustment signals include a first linearity adjustment signal input to the first field effect transistor and a second linearity adjustment signal input to the second field effect transistor, the first linearity adjustment signal having a first timing when a voltage of the first linearity adjustment signal reaches a first threshold voltage of the first field effect transistor, the second linearity adjustment signal having a second timing when a voltage of the second linearity adjustment signal reaches a second threshold voltage of the second field effect transistor, the first timing and the second timing being different from each other.

8. A transimpedance amplifier, comprising:

a variable gain circuit configured to generate a pair of complementary signals in accordance with an input signal and a reference signal, the complementary signals including a first complementary signal and a second complementary signal; and a linearity control circuit configured to generate a plurality of linearity adjustment signals to secure linearity of the variable gain circuit, wherein the variable gain circuit includes a first current source configured to supply a first current, a second current source configured to supply a second current, a first differential circuit configured to divide each of the first current and the second current into two parts in accordance with the input signal and the reference signal to generate a first current signal and a second current signal, a first load element configured to generate the first complementary signal based on the first current signal, and a second load element configured to generate the second complementary signal based on the second current signal, wherein the first differential circuit includes a first transistor including a control terminal to receive the input signal, a first current terminal to be electrically connected to the first current source, and a second current terminal to output the first current signal, a second transistor including a control terminal to receive the reference signal, a first current terminal to be electrically connected to the second current source, and a second current terminal to output the second current signal, and a variable resistance circuit including a plurality of field effect transistors, each of which is configured with a gate such that the linearity adjustment signals are input to the gates one-to-one, a source that is commonly connected to the first current terminal of the first transistor, and a drain that is commonly connected to the first current terminal of the second transistor, and wherein the linearity control circuit switches each of the field effect transistors between an ON state for electrically connecting the drain and the source thereof and an OFF state for electrically disconnecting the drain and the source thereof by the linearity adjustment signals such that a resistance value between the first current terminal of the first transistor and the first current terminal of the second transistor of the first differential circuit becomes larger as an amplitude of the input signal or an amplitude of the pair of complementary signals is larger.

9. The transimpedance amplifier according to claim 8, further comprising:

a gain control circuit configured to generate a gain adjustment signal in order to adjust a gain of the variable gain circuit, wherein the variable gain circuit further includes a second differential circuit configured to divide the first current signal into a third current signal and a fourth current signal in accordance with the gain adjustment signal, and a third differential circuit configured to divide the second current signal into a fifth current signal and a sixth current signal in accordance with the gain adjustment signal, wherein the second current terminal of the first transistor is electrically connected to the second differential circuit, wherein the second current terminal of the second transistor is electrically connected to the third differential circuit, wherein the first load element converts the fourth current signal into the first complementary signal, and wherein the second load element converts the sixth current signal into the second complementary signal.

10. The transimpedance amplifier according to claim 9, wherein the gain control circuit includes an amplitude detection circuit configured to detect amplitude of the pair of complementary signals and a first generation circuit configured to generate the gain adjustment signal based on the amplitude.

11. The transimpedance amplifier according to claim 10, wherein the linearity control circuit includes a second
- generation circuit configured to generate the linearity adjustment signals based on the amplitude detected by the amplitude detection circuit.

12. The transimpedance amplifier according to claim 8, wherein the linearity control circuit includes an amplitude
- detection circuit configured to detect amplitude of the input signal, and a generation circuit configured to generate the linearity adjustment signals based on the amplitude.

* * * * *